United States Patent
Kumagai et al.

(10) Patent No.: US 7,109,568 B2
(45) Date of Patent: Sep. 19, 2006

(54) SEMICONDUCTOR DEVICE INCLUDING N-CHANNEL FETS AND P-CHANNEL FETS WITH IMPROVED DRAIN CURRENT CHARACTERISTICS

(75) Inventors: Yukihiro Kumagai, Chiyoda (JP); Hiroyuki Ohta, Tsuchiura (JP); Shingo Nasu, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 57 days.

(21) Appl. No.: 10/625,616

(22) Filed: Jul. 24, 2003

(65) Prior Publication Data

US 2004/0217448 A1 Nov. 4, 2004

(30) Foreign Application Priority Data

Aug. 26, 2002 (JP) ............... 2002-244523

(51) Int. Cl.
*H01L 29/04* (2006.01)
(52) U.S. Cl. ........................ 257/627; 257/255
(58) Field of Classification Search ............... 257/255, 257/627, 628, 369, 371, 372
See application file for complete search history.

(56) References Cited

U.S. PATENT DOCUMENTS 3,603,848 A * 9/1971 Sato et al. ................ 257/255

FOREIGN PATENT DOCUMENTS

| JP | 60-52052 | 3/1985 |
|---|---|---|
| JP | 6-232170 | 8/1994 |
| JP | 7-321222 | 12/1995 |
| JP | 10-92947 | 4/1998 |
| JP | 11-340337 | 12/1999 |
| JP | 2000-36567 | 2/2000 |
| JP | 2000-36605 | 2/2000 |
| JP | 2000-150699 | 5/2000 |
| JP | 2000-243854 | 9/2000 |
| JP | 2001-24468 | 1/2001 |

OTHER PUBLICATIONS

Sayama, et al., "Oyo Butsuri", Applied Physics, vol. 69, No. 9, pp. 1099-1102, 2000, with English language translation.
Hamada, et al., "A New Aspect of Mechanical Stress Effects in Scaled MOS Devices", IEEE Transactions Electron Devices, vol. 38, No. 4, pp. 895-900, 1991.

* cited by examiner

*Primary Examiner*—Hung Vu
(74) *Attorney, Agent, or Firm*—Antonelli, Terry, Stout and Kraus, LLP.

(57) ABSTRACT

In a semiconductor device including n-channel field-effect transistors and p-channel field-effect transistors, in which the channel direction is parallel to a axis, a semiconductor device in provided which has excellent drain current characteristics at both n-channel field-effect transistors and p-channel field-effect transistors. In a semiconductor device including n-channel field-effect transistors N1 and N2 and p-channel field-effect transistors P1 and P2, a stress control film that covers the gate electrodes of the n-channel and p-channel field-effect transistors from upper surfaces thereof is not formed, or is made thin, above shallow trench isolations adjacent to active regions formed by the p-channel field-effect transistors P1 and P2, in a case where the stress control film is a tensile film stress. Thus, improvement of the drain currents of both the n-channel and p-channel transistors can be expected. For this reason, it is possible to improve overall characteristics.

7 Claims, 12 Drawing Sheets

SEMICONDUCTOR DEVICE INCLUDING N-CHANNEL FETS AND P-CHANNEL FETS WITH IMPROVED DRAIN CURRENT CHARACTERISTICS

BACKGROUND OF THE INVENTION

The present invention relates to a semiconductor device, and, in particular, to a semiconductor device that includes complementary field-effect transistors, comprising n-channel field-effect transistors and p-channel field-effect transistors.

In recent years, the processing power demanded of semiconductor devices, such as provided ion LSI, has become greater in accompaniment with the development of information communication equipment, and the working speed of transistors is being increased. In particular, complementary field-effect transistors in the form of n-channel field-effect transistors and p-channel field-effect transistors are being widely used because of their low power consumption. Increases in the speed of such transistors have advanced mainly due to the miniaturization of their structures, and such advances have been supported by the progress in lithographic technology which is used for finishing the semiconductor devices.

However, more recently, minimum finishing dimensions (minimum finishing conditions of gates) have become equal to or less than the wavelength levels of the light used in the lithography processing, and so further miniaturization of finishing dimensions is becoming more difficult.

Using the fact that electron mobility (effective mass) changes when silicon crystals are strained, a method has been proposed in which silicon germanium, which has a larger lattice constant than silicon, is used for a substrate film for forming field-effect transistors, and a silicon layer is epitaxially grown thereon, whereby strain is imparted to the silicon serving as a channel portion, the mobility is raised, and the speed of the transistors is increased, as disclosed in JP-A-11-340337.

Also, a method in which the start-up delay of drain currents is controlled by stress control of the gate electrodes of field-effect transistors is disclosed in JP-A-6-232170.

In semiconductor devices in recent years, increases in the working speed of field-effect transistors have been achieved. As one means therefor, a method is being considered in which a silicon germanium material, which has a larger lattice constant that silicon, is used for a silicon substrate of channel portions, to thereby impart strain to the silicon and raise the mobility.

However, when materials having different crystal lattice constants are epitaxially grown so that the lattices are aligned, as disclosed in JP-A-11-340337, the energy of the strain generated in the crystal is large. With respect to a film thickness that is equal to or greater than a critical film thickness, there is the problem that rearrangement is generated in the crystal, and in processes for manufacturing semiconductor devices such as LSI, there is an increase in the cost accompanying the introduction of new semiconductor devices, resulting from the introduction of uncommon materials, such as silicon germanium, so that practical utilization of this technique is not easy.

Also, complementary field-effect transistors are formed by n-channel field-effect transistors using electrons as a carrier and p-channel field-effect transistors using positive holes as a carrier, and so it is preferable to increase the speeds of both the n-channel field-effect transistors and the p-channel field-effect transistors in order to increase the speed of the semiconductor device as a whole.

In JP-A-6-232170, the target transistor is disclosed as a transistor created by a chemical semiconductor. Currently, consideration is not being given to transistors created on a silicon substrate as mainly used in LSI and a DRAM. The field-effect transistors therein are only n-channel field-effect transistors, and so consideration is only given to one axis with respect to the control direction of the stress, and the transistors have been insufficient.

The direction (direction in which the drain currents mainly flow) of the channels of field-effect transistors formed on a silicon substrate is commonly aligned with a direction parallel to a <110> crystal axis. However, the development of complementary field-effect transistors, in which the channel direction is used as the <100> crystal axis direction, is advancing from the standpoint of increasing the speed of a p-channel field-effect transistor (Hirokazu Sayama and Yasuaki Inoue, Oyo Butsuri ("Applied Physics"), Vol. 69, No. 9, p. 1099 (2000)). The mechanism by which the speed of the p-channel field-effect transistors is increased is thought to result from the hole mobility of a positive hole of the <100> crystal axis being greater in comparison to that of the <110> axis, and due to the short channel characteristics being improved.

However, the difference in the crystal axes resides not only in the fact that ideal mobility (no strain) of the silicon crystal changes, but there is a potential for the sensitivity with respect to stress (strain) to also change. In other words, there is a potential for the drain current (mobility), which is increased by tensile strain in <1.10> axis transistors, to be lowered in <100> axis transistors.

Therefore, in techniques based on increasing the speed by straining the crystal, the transistors whose channel direction is the <100> axis direction may be different from field-effect transistors whose channel direction is the <110> axis direction that are commonly considered.

SUMMARY OF THE INVENTION

It is an object of the present invention to effectively realize, in a semiconductor device including n-channel field-effect transistors and p-channel field-effect transistors, whose channel direction is a <100> axis direction, a semiconductor device in which the drain current characteristics of the n-channel field-effect transistors and the p-channel field-effect transistors are excellent.

The present inventors have measured the stress dependency of drain currents of field-effect transistors whose channel direction is the <100> axis direction, and it has been demonstrated that the stress dependency thereof is different than that of transistors of the common <110> axis direction.

FIG. 2 is a graph showing experimental results concerning the stress dependency of drain currents of n-channel field-effect transistors and p-channel field-effect transistors, which are formed on an Si (001) surface so that the drain currents flow parallel to the <100> axis. The gate length of the evaluated field-effect transistors was 0.2 μm. The directions of the stress were uniaxial stress (stress parallel to the channels) within the channel surface in a direction parallel to the drain currents flowing through the channels of the field-effect transistors and uniaxial stress (stress orthogonal to the channels) within the channel surface in a direction orthogonal to the drain currents. With respect to the reference values of the stress, plus represents tensile stress and minus represents compression stress.

In FIG. 2, in the case of the n-channel field-effect transistors, the drain currents increased with respect to tensile stress (stress parallel to the channels was about 4.3%/100 MPa, and the stress orthogonal to the channels was about 0.85%/100 MPa).

In the case of the p-channel field-effect transistors, the drain currents increased with respect to compression stress (stress parallel to the channels was about 0.41%/100 MPa, and the stress orthogonal to the channels was about 2.2%/100 MPa).

FIG. 3 illustrates results obtained when an experiment that was the same as the above-described experiment was conducted in regard to transistors whose channel direction was the <110> direction.

In FIG. 3, in the case of the n-channel field-effect transistors, the drain currents increased with respect to tensile stress (stress parallel to the channels was about 4.3%/100 MPa, and stress orthogonal to the channels was about 1.7%/100 MPa).

In the case of the p-channel field-effect transistors, the drain currents increased with respect to the direction orthogonal to the channels (about 3.6%/100 MPa), but the drain currents decreased with respect to the direction parallel to the channels (about 6.3%1100 MPa).

From FIGS. 2 and 3, it will be understood that the stress dependency of the drain currents differs greatly depending on the channel direction. In particular, the difference in dependency in p-channel field-effect transistors is great, and when transistors that are parallel to the <100> axis are created with the same stress control as transistors that are parallel to the <110> axis, it is thought that there is the potential for the drain currents to be reduced.

In other words, it was demonstrated that, in order to increase the drain current of transistors whose channel direction is the <110> axis direction, the tensile stress should be loaded to the n-channel field-effect transistors in directions parallel and orthogonal to the inside of the channel surface, and compression stress should be loaded to the p-channel field-effect transistors in directions parallel and orthogonal to the inside of the channel surface.

In the debate within elastic deformation, stress and strain are in a proportional relation. Therefore, in the aforementioned experimental results, the reason why the drain current increases when tensile stress is loaded to the n-channel field-effect transistors that are parallel to the channel is believed to be because the crystal lattice of the silicon configuring the channel is strained in a tensile direction parallel to the inside of the channel in comparison with that prior to loading the stress, whereby the electron mobility increases. It is possible to measure this strain generated in the silicon crystal by use of a TEM, electron beam analysis, and Raman spectrometry.

In multilayer film laminate structures, such as transistors, thermal stress resulting from differences in the coefficient of linear expansion between the materials and inherent stress resulting from differences in the lattice constant and film contraction at the time of crystallization are generated, and residual stress is generated in the structure interior. Generations of field-effect transistors whose miniaturization has advanced over the years are commonly expressed by their gate lengths.

The present inventors demonstrated that, when stress analysis of field-effect transistor structures is conducted and reduction of the manufacturing dimensions of the gates advances, stress generated in the interiors of the structures becomes large due to the miniaturization of the structures and the use of new materials. Particularly, in field-effect transistors which belong to the generation having a 0.1 μm gate length, stress stemming from oxidation due to STIs (Shallow Trench Isolations) becomes a source of stress.

FIG. 4 is a graph showing results in which the stress of channel portions of each generation of gate length is analyzed by the finite element method. In FIG. 4, stress generated in channel portions under the gate is low in a transistor belonging to the generation in which the gate length is a comparatively large 2 μm. However, stress becomes drastically higher in a transistor belonging to the generation in which the gate length is 0.25 μm or less, and reaches almost 3 times that of the 2 μm generation in the 0.1 μm generation. Research is being conducted in regard to the influence of stress generated in field-effect transistors on transistor characteristics. For example, research is being conducted in regard to the stress dependency of mutual conductance, which is one characteristic of field-effect transistors (Akemi Hamada, et al., IEEE Trans. Electron Devices, Vol. 38, No. 4, pp. 895–900, 1991).

However, conventionally, there was no problem of the characteristics of field-effect transistors fluctuating due to stress. This is thought to be because, as shown in FIG. 4, the stress generated in transistor structures was small in pre-0.25 μm field-effect transistors, i.e., of 0.25 μm or greater. Moreover, it is also conceivable that the sensitivity of the transistors themselves with respect to stress was also low.

Thus, when the present invention is adapted to a semiconductor device whose gate length is 0.25 μm or lower, it proves effective and is preferable.

FIG. 5 is a graph in which experimental results (gate length: 2 μm) of stress dependency of mutual conductance Gm of the aforementioned reference (Akemi Hamada, et al., IEEE Trans. Electron Devices, Vol. 38, No. 4, pp. 895–900, 1991) are compared with experimental results (gate length: 0.2 μm) of stress dependency of the mutual conductance Gm of the inventors.

The comparison in FIG. 5 was conducted by loading stress in a direction parallel to the channel with respect to n-channel field-effect transistors in which the channel was parallel to the <110> crystal axis. The dependency of Gm with respect to stress was about four times larger in the transistors of the generation in which the gate length was 0.2 μm than it was in the transistors of the generation in which the gate length was 2 μm. That is, the comparison illustrates that the sensitivity of transistor characteristics with respect to stress has become higher with the advancement of the generations of the transistors.

According to stress analysis, with respect to stress distribution in the substrate depth direction formed in the channel portion of an Si substrate of a field-effect transistor, a place at which stress concentrates is formed near the gate electrode. The diffusion zone formation region of a transistor of the generation in which the gate length is a small 0.1 μm is formed in a shallow region near the substrate surface in comparison to a conventional transistor having a large gate length. As a result, it is conceivable that, in transistors of the 0.1 μm generation, device movement regions are easily influenced by stress.

Thus, the present inventors have conducted stress analysis using the finite element method in regard to field-effect transistor structures having a gate length of 0.08 μm, and they have conducted sensitivity analysis in regard to the influence that materials configuring field-effect transistors and peripheral materials thereof exert on the stress of the channel portion in which the drain current flows. The standard dimensions (thickness) of the structures used in the sensitivity analysis were as follows. The gate length was 80 nm, the gate height was 150 nm, the film thickness of the film enclosing the gate electrode from the upper surface thereof was 50 nm, the side wall film thickness (portions contacting the silicon substrate) was 50 nm, the silicide film thickness was 30 nm, the STI trench width was 5 μm, the STI trench depth was 350 nm, and the distance from the gate electrode to the STI was 0.62 μm. In the present specification, silicon nitride is expressed as SiN and silicon oxide is expressed as $SiO_2$.

As a result, the present inventors have demonstrated that the stress of the film (assuming an SiN film in the analysis) enclosing the gate electrode from the upper surface thereof and stress of the STI have a big influence on the stress of the channel portion (FIGS. 6 and 7).

The present inventors have demonstrated that, in order for the stress of the channel portion to be a compression stress, the present invention could be achieved by increasing the area of the SiN, which serves as an inherent stress of compression covering the gate electrode, covering the transistor or by narrowing the STI trench width.

In light of the above-described matters, it is preferable to provide the following features.

In a semiconductor device including n-channel field-effect transistors and p-channel field-effect transistors formed on a silicon substrate, the direction in which the drain current of the transistors mainly flows is parallel to a <100> crystal axis or to a direction equivalent to the <100> crystal axis, and the residual stress (residual strain) of the channel portion of the n-channel field-effect transistors is greater at the tensile stress side than the residual stress (residual strain) of the channel portion of the p-channel field-effect transistors.

Additionally, in a semiconductor device including n-channel field-effect transistors and p-channel field-effect transistors formed on a silicon substrate, the direction in which the drain current of the transistors mainly flows is parallel to a <100> crystal axis, or to a direction equivalent to the <100> crystal axis, the residual stress (residual strain) of the channel portion of the n-channel field-effect transistors is tensile stress (tensile strain), and the residual stress (residual strain) of the channel portion of the p-channel field-effect transistors in a direction along the direction in which the drain current flows is compression stress (compression strain).

Thus, because the drain current characteristics of both the n-channel and the p-channel can be improved, it is possible to realize a semiconductor device that has excellent characteristics overall.

Also, the semiconductor device of the invention can realize a highly reliable semiconductor device in which defects are suppressed.

It should be noted that the axis equivalent to the <100> crystal axis is, for example, a <010> axis, a <001> axis, a <−1,0,0> axis, or a <0,−1,0> axis.

In order to achieve any of the above-described features, the following configurations are preferable.

(1) The invention is directed to a semiconductor device which includes n-channel field-effect transistors and p-channel field-effect transistors formed on a semiconductor substrate, wherein: the transistors are disposed with a gate electrode and a source and a drain corresponding thereto; the direction joining the source and the drain extends along a <100> crystal axis, or an axis equivalent to the <100> crystal axis; and compression strain is formed, in which the crystal strain of channel portions of the p-channel field-effect transistors is greater than the crystal strain of channel portions of the n-channel field-effect transistors.

Specifically, the semiconductor device is characterized in that a compression strain is formed in which the crystal strain in a direction orthogonal to the direction joining the source and the drain in a surface parallel to a gate insulating film of the channel portions of the p-channel field-effect transistors is greater than the crystal strain of channel portions of the n-channel field-effect transistors. More preferably, the semiconductor device is characterized in that, in addition to the above-described features, a compression strain in which the crystal strain in a direction orthogonal to the direction joining the source and the drain is greater than the crystal strain of the channel portions of the n-channel field-effect transistors.

Alternatively, it can be said that the channel portions of the p-channel field-effect transistors in a direction orthogonal to the direction joining the source and the drain form a compression strain that is larger than that of the channel portions of the n-channel field-effect transistors in a direction orthogonal to the direction joining the source and the drain. More preferably, a large compression strain is also similarly formed in a direction parallel to the direction joining the source and the drain.

Thus, it is possible to improve the overall current characteristics of a semiconductor device that is disposed with r-channel field-effect transistors and p-channel field-effect transistors. Moreover, because adjustment changes of the insulating film do not influence the current characteristics, the above-described structure can effectively achieve the same effects. It should be noted that, in the semiconductor device, the insulating film may include silicon nitride as a main component.

(2) The arrangement of paragraph (1) can also be a semiconductor device characterized in that a tensile strain is formed in which the crystal strain of channel portions of the n-channel field-effect transistors is greater than the crystal strain of channel portions of the p-channel field-effect transistors.

Here, it is preferable for the direction along the axis to be parallel to the axis. However, the direction is not limited to this. It is necessary for the direction to be disposed so that the <100> axis/equivalent axis direction is closer than a direction (e.g., <110> or a direction equivalent thereto) of at least 45° to the axis. Moreover, it is even more preferable for the direction to be disposed in a range of about ±5° thereto even, if it is not strictly parallel, as described above, due to manufacturing errors and other factors.

The semiconductor device is characterized in that a tensile strain is formed in which the crystal strain in directions parallel and orthogonal to the direction joining the source and the drain in the surface parallel to the gate insulating film of the channel portions of the n-channel field-effect transistors is greater than that of the channel portions of the p-channel field-effect transistors.

Alternatively, the channel portions of the n-channel field-effect transistors in the directions parallel and orthogonal to the direction joining the source and the drain form a tensile strain that is larger than that of the channel portions of the p-channel field-effect transistors in the directions parallel and orthogonal to the direction joining the source and the drain.

(3) The invention is also directed to a semiconductor device which includes a semiconductor substrate, a gate electrode and plural transistors formed on the semiconductor substrate, the plural transistors being provided with a drain and a source corresponding to the gate electrode, an insulating film formed above the transistors and having higher resistance than that of the semiconductor substrate, with a direction joining the source of the transistors and the corresponding drain extending in a direction along a <100> crystal axis, or an axis equivalent to the <100> crystal axis, the transistors including plural n-channel field-effect transistors and plural p-channel field-effect transistors, the insulating film being subject to tensile stress, the insulating film that is formed in regions at the peripheries of the p-channel field-effect transistors and positioned in directions parallel and orthogonal to the direction joining the source and the drain including an insulating film that is thinner than the insulating film that is formed in regions at the peripheries of the p-channel field-effect transistors and positioned in directions parallel and orthogonal to the direction joining the source and the drain.

(4) The semiconductor device may include an interlayer insulating film including an upper end above the insulating film and a wiring layer above the interlayer insulating film.

(5) Alternatively, the arrangement of paragraph (3) may be a semiconductor device characterized in that the insulating film that is thinner than the insulating film formed at regions positioned between the first n-channel field-effect transistors and the second n-channel field-effect transistors is formed on, or not disposed on, field regions adjacent to the active regions of the p-channel field-effect transistors.

(6) The semiconductor device may also be characterized in that an insulating film subjected to tensile stress is formed at upper portions of the n-channel field-effect transistors and the p-channel field-effect transistors, and the insulating film that is thinner than the insulating film formed at regions positioned between first n-channel field-effect transistors and second n-channel field-effect transistors is formed on, or not disposed on, field regions adjacent to active regions of the p-channel field-effect transistors.

(7) In contrast to the arrangement of paragraph (3), when the insulating film is subject to compression stress, the semiconductor device may be characterized in that the insulating film, that is formed in regions at the peripheries of the n-channel field-effect transistors and is positioned in directions parallel and orthogonal to the direction joining the source and the drain, includes an insulating film that is thinner than the insulating film that is formed in regions at the peripheries of the p-channel field-effect transistors and is positioned in directions parallel and orthogonal to the direction joining the source and the drain.

The peripheries of the transistors can be regions between the transistors and transistors positioned at the peripheries thereof. When the transistors are positioned as a group, the periphery of the transistors can be a peripheral region of the group.

(8) Alternatively, the arrangement of paragraph (7) may be a semiconductor device characterized in that the insulating film that is thinner than the insulating film formed at regions positioned between first p-channel field-effect transistors and second p-channel field-effect transistors is formed on, or not disposed on, field regions adjacent to the active regions of the n-channel field-effect transistors.

(9) The semiconductor device may also be characterized in that an insulating film subject to compression stress is formed at upper portions of the n-channel field-effect transistors and the p-channel field-effect transistors, and the insulating film that is thinner than the insulating film formed at regions positioned between first p-channel field-effect transistors and second p-channel field-effect transistors is formed on, or not disposed on, field regions adjacent to active regions of the n-channel field-effect transistors.

(10) The invention is also directed to a semiconductor device which includes a semiconductor substrate, a gate electrode formed via element isolating regions, plural transistors disposed with a drain and a source corresponding to the gate electrode, the gate electrode and the transistors being formed on the semiconductor substrate, an insulating film formed above the transistors, with a direction joining the source and the corresponding drain of the transistors extending in a direction along a <100> crystal axis, or an axis equivalent to the <100> crystal axis, the transistors including plural n-channel field-effect transistors and plural p-channel field-effect transistors, and the trench width of the element isolating regions adjacent to the p-channel field-effect transistors is narrower than the trench width of the element isolating regions adjacent to the n-channel field-effect transistors.

Thus, in addition to the effect of overall improvement, the invention can easily and effectively achieve the above-stated effects, because the mask pattern is adjusted.

(11) Also, in the arrangement of paragraph (10), the trench width of the element isolating regions, that are adjacent to regions at which the p-channel field-effect transistors are formed and positioned in directions parallel and orthogonal to the direction joining the source and the drain, is narrower than the trench width of the element isolating regions that are adjacent to regions at which the n-channel field-effect transistors are formed and positioned in directions parallel and orthogonal to the direction joining the source and the drain.

(12) The invention is also directed to a semiconductor device including n-channel field-effect transistors and p-channel field-effect transistors formed on a substrate, wherein the Raman shift of Raman spectrometry, which occurs when a laser is irradiated onto channel portions of the n-channel field-effect transistors, is smaller than the Raman shift of Raman spectrometry which occurs when a laser is irradiated onto channel portions of the p-channel field-effect transistors.

(13) In the arrangements of paragraphs (1) to (11), the semiconductor device may be characterized in that the insulating film includes silicon nitride as a main component.

(14) The invention is also directed to a method of manufacturing a semiconductor device, the method comprising the steps of: forming, on a semiconductor substrate, n-channel field-effect transistors and p-channel field-effect transistors having a gate electrode and a drain and a source corresponding to the gate electrode; depositing a stress control film so as to cover the field-effect transistors; depositing and patterning a mask above the stress control film; etching the stress control film; depositing an interlayer insulating film after depositing the stress control film; and forming, above the interlayer insulating film, a wiring layer that electrically communicates with the transistors, wherein a direction that joins the source and the drain extends in a direction along a <100> crystal axis, or an axis equivalent to the <100> crystal axis, wherein tensile or compression strain is made to reside in the stress control film, and channel portions of the p-channel field-effect transistors, in directions parallel and orthogonal to the direction joining the source and the drain, are formed so as to include a compression strain that is larger than that of channel portions of the n-channel field-effect transistors in directions parallel and orthogonal to the direction joining the source and the drain.

(15) In the arrangement of paragraph (14), the etching step removes the stress control film from regions forming contact plugs, and removes or makes the stress control film thinner than the peripheries of the n-channel field-effect transistors at peripheries of the p-channel field-effect transistors.

(16) The invention is also directed to a semiconductor device including a semiconductor substrate, a gate electrode and plural transistors formed on the semiconductor substrate, the transistors having a drain and a source corresponding to the gate electrode, and plural circuits disposed with the transistors, wherein a first circuit is disposed with a first transistor and a second circuit is disposed with a second transistor, a direction joining a corresponding drain and a source configuring the first transistor of the first circuit extends in a direction along a <100> crystal axis of the substrate, or an axis equivalent to the <100> crystal axis, and a direction joining a corresponding drain and a source configuring the second transistor of the second circuit extends in a direction along the <110> crystal axis of the substrate, or an axis equivalent to the <110> crystal axis.

It should be noted that, in the arrangement of paragraph (16), the first circuit is a memory and the second circuit is a peripheral circuit, such as a low voltage circuit. The memory circuit may be, for example, an SRAM.

By configuring the invention in this manner, it is possible to form a chip that has excellent speed, an excellent circuit layout, and excellent manufacturability.

Also, it is preferable to form a high-speed operating memory in a direction of the <100> axis, or an axis equivalent thereto, to form a constant voltage circuit, of which the same high speed is not demanded, in a direction of the <110> axis, or an axis equivalent thereto, and to dice the semiconductor substrate disposed with these circuits along a direction of the <110> axis, or an axis equivalent thereto.

Upon searching well-known examples, the following related technologies were extracted, which relate to the application of stress to the channel portions. However, in none of these technologies could there be found anything relevant to the configuration of the invention as disclosed in the present application.

JP-A-60-52052 discloses a technique which involves disposing a spinel layer under a p-channel portion and an SiO2 layer under an n-channel portion to separately create channel portion substrate layers. JP-A-7-321222, JP-A-10-92947, JP-A-2000-243854, and JP-A-2000-150699 disclose the use of an SiGe layer, in which an Si layer is disposed on the p-channel, and the use of an Si layer, in which SiGe is disposed on the n-channel, to separately create channel portion substrate layers. However, because the layers are inserted in the substrate regions (regions underneath a region in which positive holes or electrons of the channel portions flow (e.g., regions separated in the opposite direction from the gate insulating film about 5 nm or more from the interface with the gate insulating film)), there is the potential for defects to exert an influence on the electrical characteristics, such as a leakage current, when defects arise in the interface between the channels and the substrate and in end portions. Additionally, JP-A-2000-36567, JP-A-2000-36605, and JP-A-2001-24468 disclose the use of LOCOS for element isolating portions adjacent to transistors, such as a PMOS, controlling the oxidation amount thereof, and adding stress. However, because the elements are isolated by LOCOS, it is difficult to effectively apply this technology to high integration, the steps for separately creating it from STI increase, and there is the potential for the manufacturing costs to increase significantly.

DESCRIPTION OF THE PREFERRED EMBODIMENTS

A first embodiment of the invention will be described with reference to FIGS. 1, 2, 6, 8, 9, 10(a) to 10(c), 11, 12 and 24.

Figure 1:
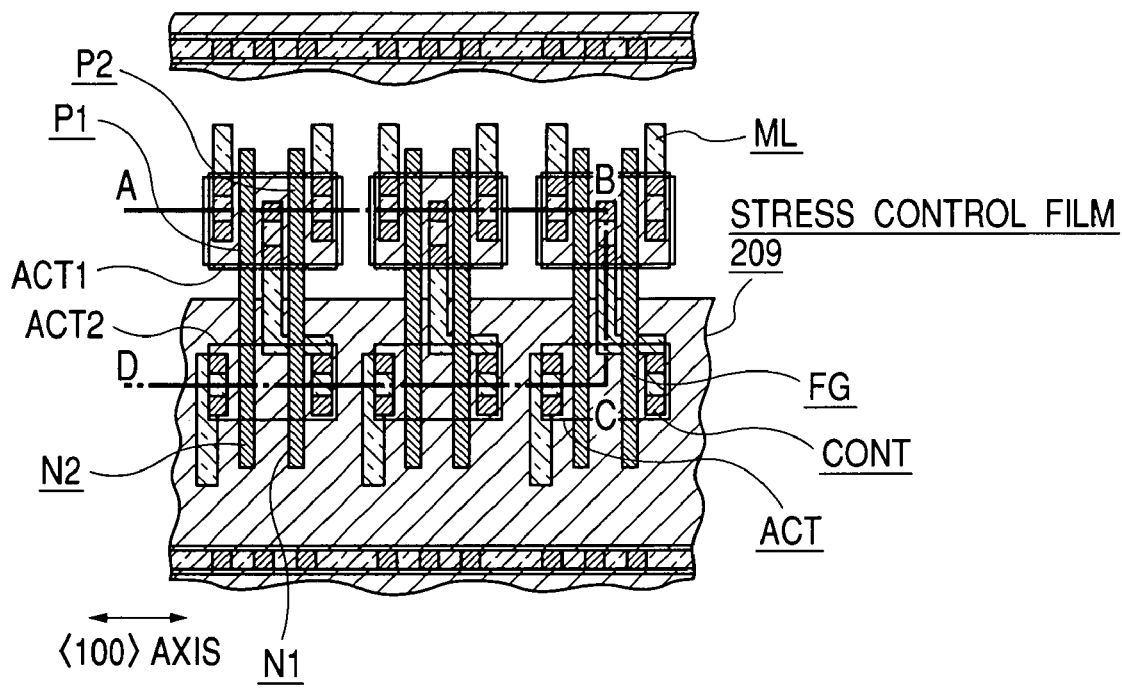
FIG. 1 is a diagrammatic plan view (partial enlarged view of FIG. 9) of a semiconductor device pertaining to a first embodiment of the invention.
Figure 2:
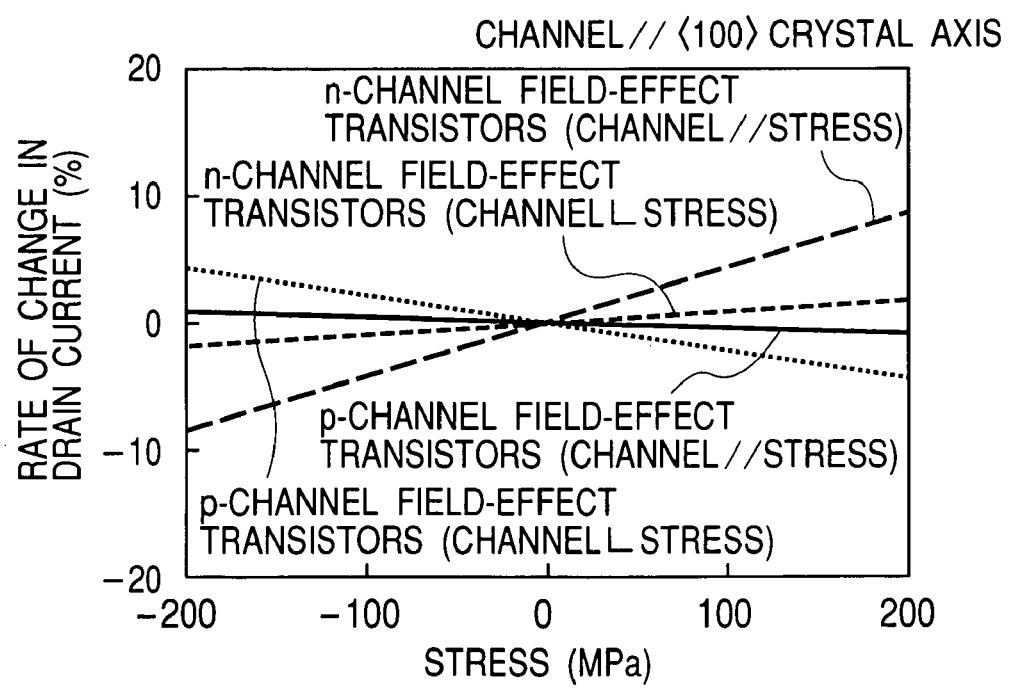
FIG. 2 is a graph showing experimental results which indicate the stress dependency of drain currents of n-channel and p-channel field-effect transistors in which the channel direction is parallel to a <100> axis.
Figure 3:
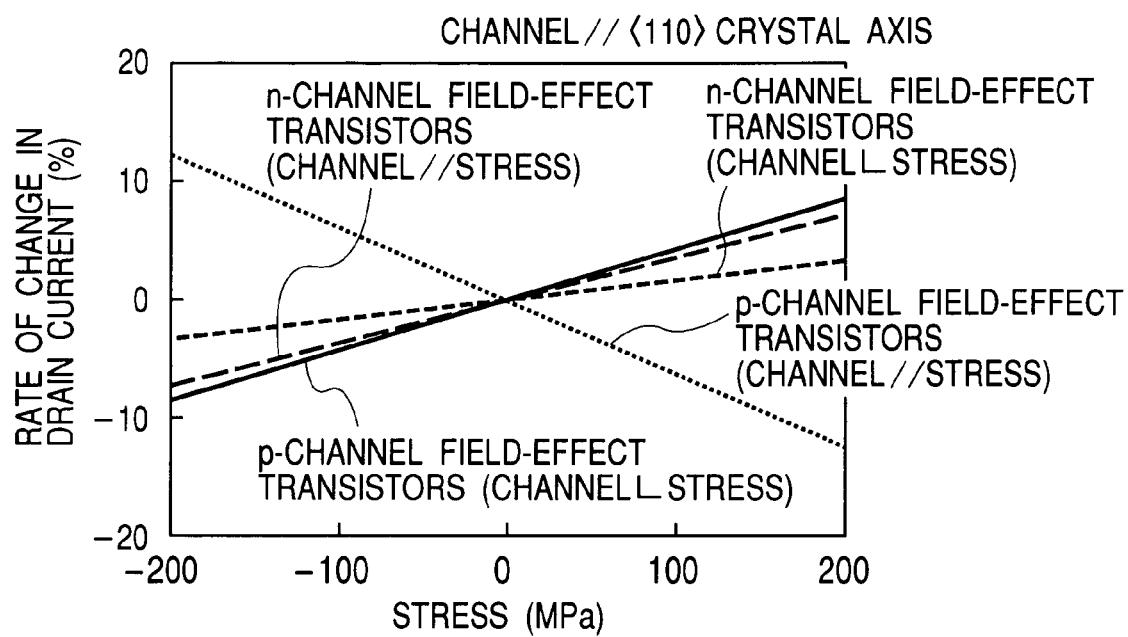
FIG. 3 is a graph showing experimental results which indicate the stress dependency of drain currents of n-channel and p-channel field-effect transistors in which the channel direction is parallel to a <110> axis.
Figure 6:
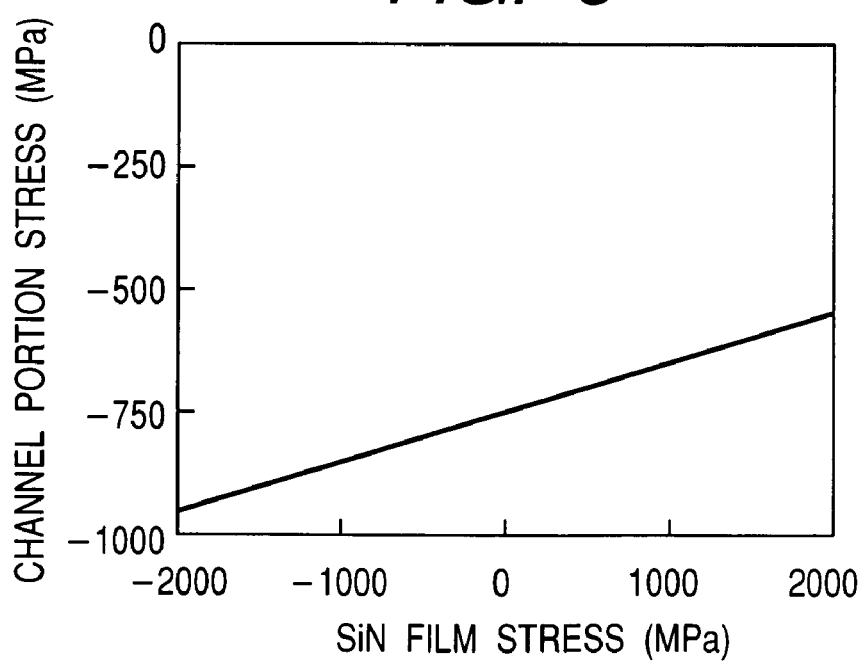
FIG. 6 is a graph showing results in which the influence that intrinsic stress of an SiN film, which encloses a gate electrode from an upper surface thereof, exerts on stress of a channel portion is analyzed.
Figure 7:
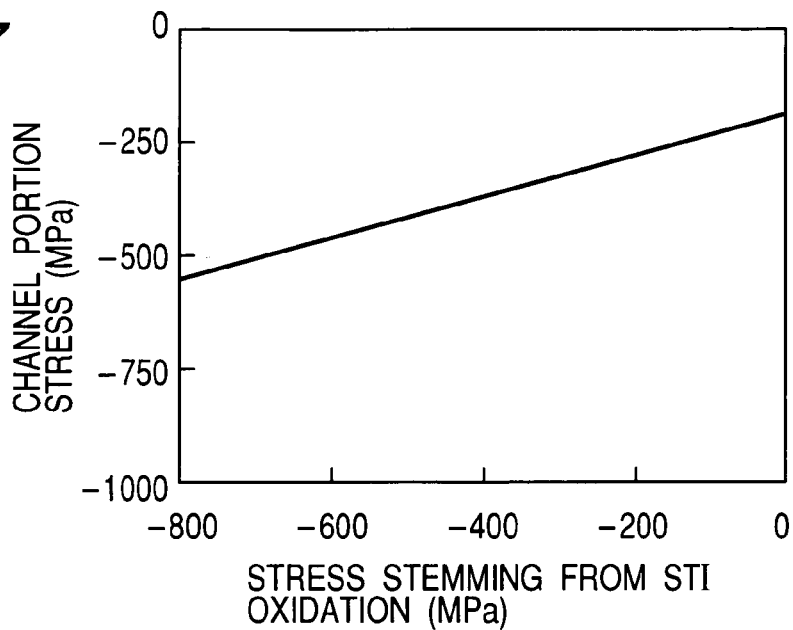
FIG. 7 is a graph showing results in which the influence that stress originating with oxidation of STI exerts on stress of a channel portion is analyzed.
Figure 8:
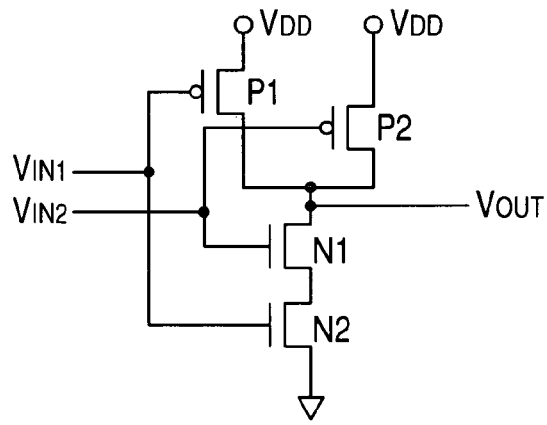
FIG. 8 is an electrical circuit diagram of the semiconductor device pertaining to the first embodiment of the invention.
Figure 9:
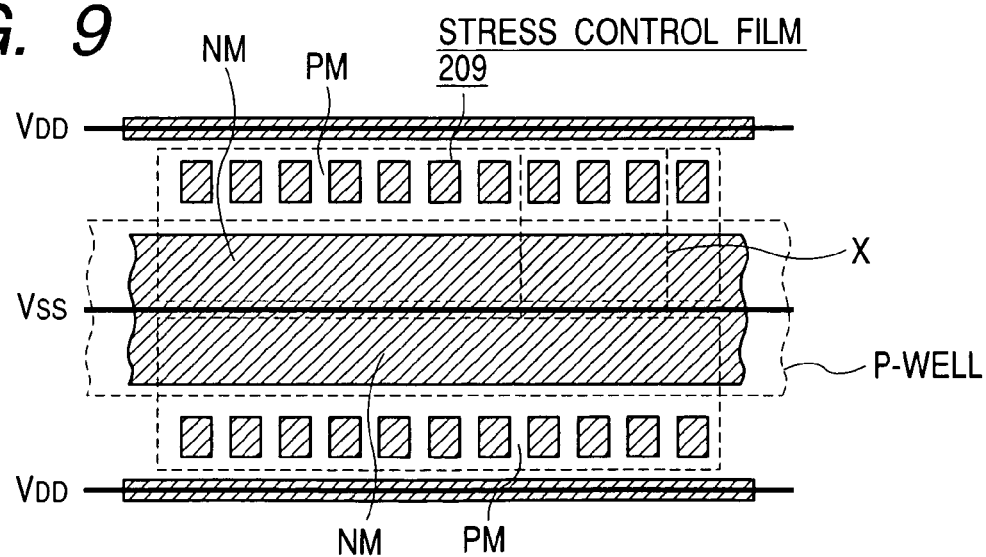
FIG. 9 is a diagrammatic plan view of the semiconductor device pertaining to the first embodiment of the invention.
Figure 10A:
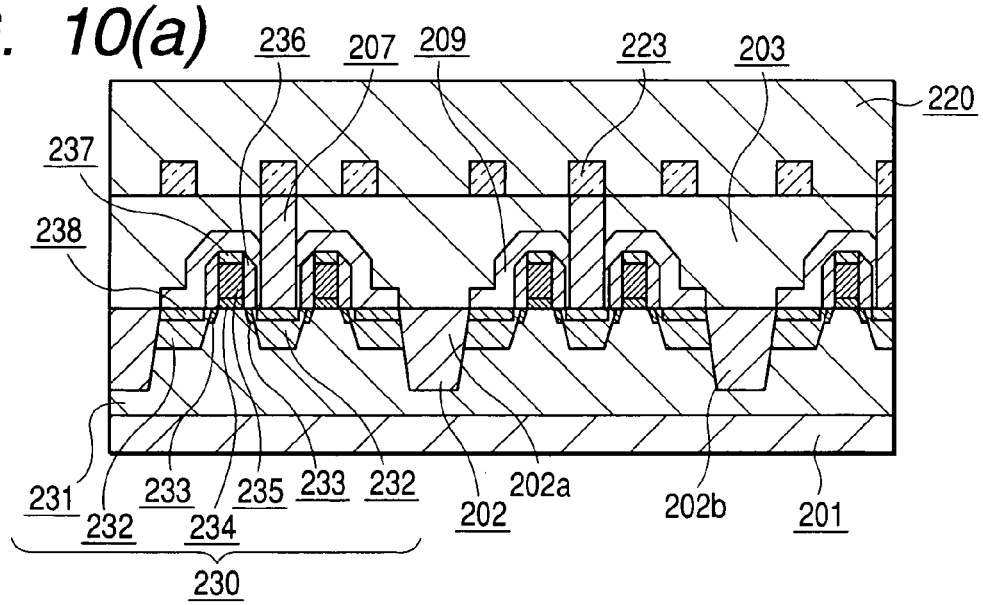
FIGS. 10(a), 10(b) and 10(c) are diagrammatic cross-sectional views showing a cross section of the semiconductor device pertaining to the first embodiment of the invention, taken along lines A–B, B–C and D–C, respectively, in FIG. 1.
Figure 10B:
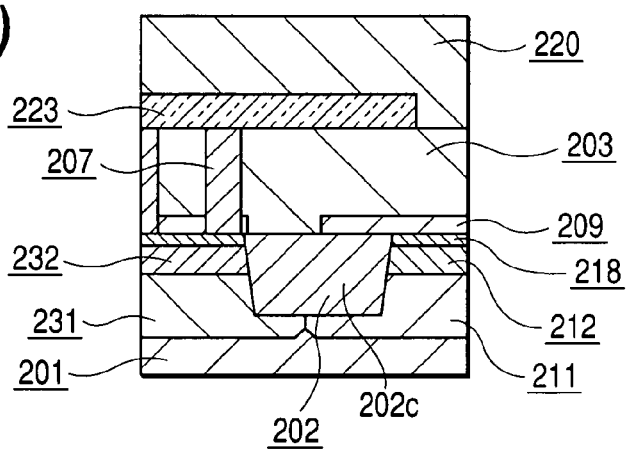
Figure 10C:
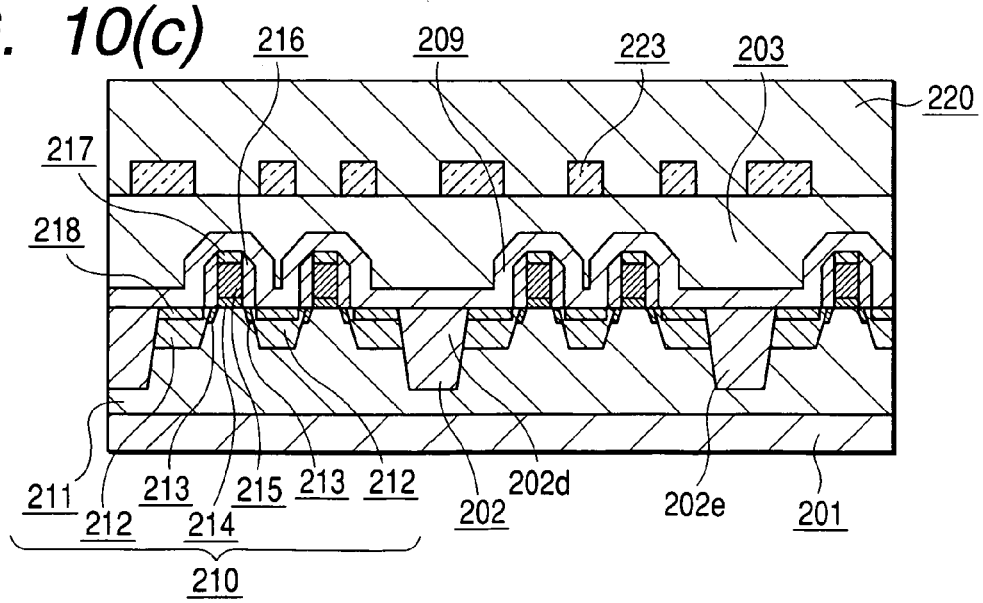
Figure 11:
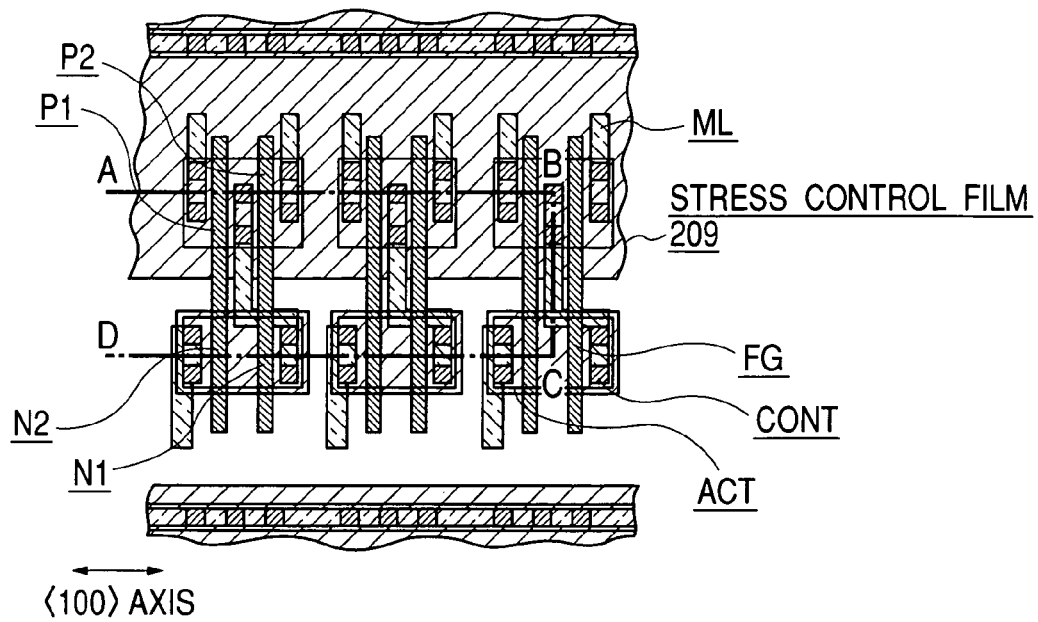
FIG. 11 is a diagrammatic plan view (partial enlarged view of FIG. 12) of another semiconductor device pertaining to the first embodiment of the invention.
Figure 24:
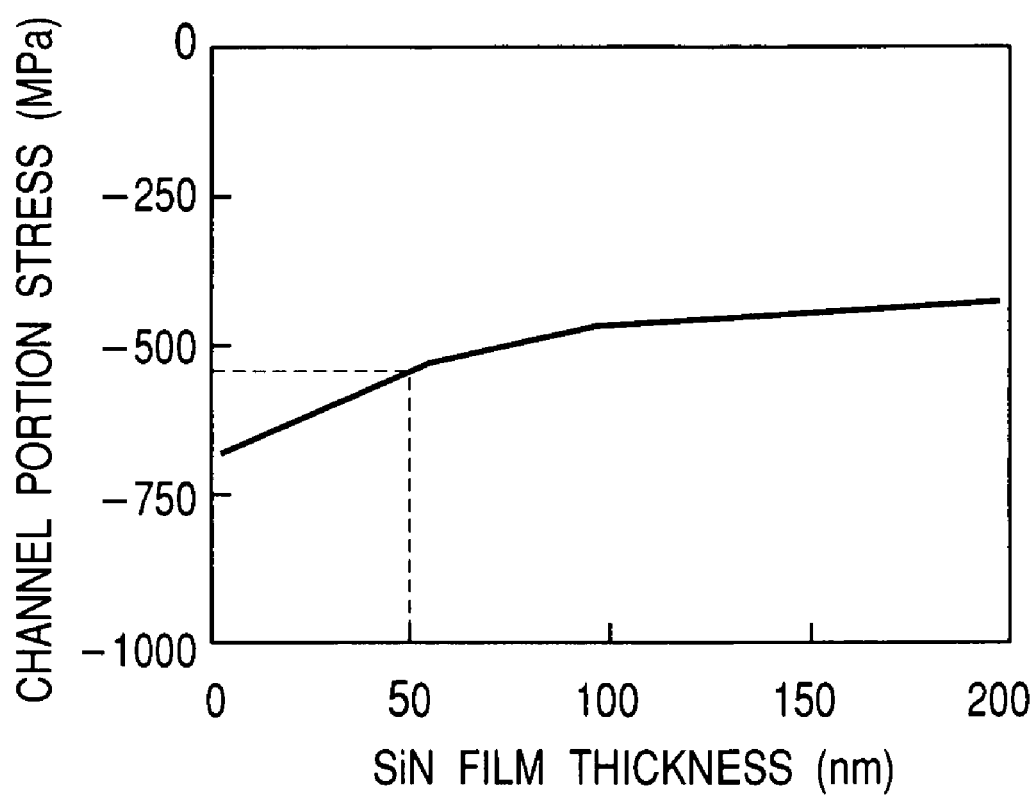
FIG. 24 is a graph showing results in which the influence that film thickness of an SiN film, which encloses a gate electrode from an upper surface thereof, exerts on stress of a channel portion is analyzed.

FIG. 1 is a pattern diagram (pattern diagram in which part (vicinity in a frame indicated by X) of FIG. 9 has been enlarged) of a plane layout of the semiconductor device of the first embodiment of the invention; FIG. 2 is a graph showing stress dependency of drain currents of field-effect transistors in which the channel direction is a <100> axis direction; FIG. 6 is a graph showing results in which the influence that intrinsic stress of an SiN film, which encloses a gate electrode from an upper surface thereof, exerts on stress of a channel portion (stress within a channel surface parallel to a drain current) is analyzed; FIG. 8 is a diagram of a 2NAND circuit to which the present embodiment is applied; FIG. 9 is a pattern diagram of a plane layout of the semiconductor device of the present embodiment; and FIGS. 10(a), 10(b) and 10(c) are pattern diagrams showing a cross-sectional structure of the plane layout of FIG. 1 taken along the lines A–B, B–C and D–C, respectively. FIG. 11 is a pattern diagram (in which part (vicinity within a frame indicated by X) of FIG. 12 has been enlarged) of a plane layout of a semiconductor device pertaining to another embodiment of the invention in a case where a stress control film is compression stress; and FIG. 24 is a graph showing results in which the influence that film thickness of an SiN film, which encloses a gate electrode from an upper surface thereof, exerts on stress of a channel portion (stress within a channel surface parallel to a drain current) is analyzed.

The semiconductor device of the first embodiment of the invention includes, on a semiconductor substrate, plural active regions (element forming regions) enclosed by a field region (element isolating region), and transistors are formed in the active regions. The transistors are formed on a (100) surface of a silicon substrate, which is the semiconductor substrate, or on a surface equivalent to the (100) surface.

The semiconductor device includes a 2NAND circuit comprising two p-channel field-effect transistors P1 and P2, in which the channel direction is parallel to a <100> crystal axis, and two n-channel field-effect transistors N1 and N2. These transistors N1, N2, P1 and P2 respectively correspond to transistors N1, N2, P1 and P2 shown in FIG. 8.

In FIG. 1, one 2NAND circuit is configured by the p-channel field-effect transistor P1 and the n-channel field-effect transistor N2, which share a gate electrode FG, as well as the p-channel field-effect transistor P2 and the n-channel field-effect transistor N1, a contact plug CONT for the improving electrical connection of the transistors, and wiring ML. Here, the p-channel field-effect transistors P1 and P2 are formed on one active region ACT1, and the n-channel field-effect transistors N1 and N2 are formed on one active region ACT2.

The semiconductor device of the present embodiment has a pattern in which plural 2NAND circuits are continuous in a line, and repeated. That is, as shown in FIG. 9, the semiconductor device is configured by the p-channel field-effect transistors P1 and P2, regions NM in which n-channel field-effect transistors that comprise the n-channel field-effect transistors N1 and N2 are plurally repeatedly in line and are continuous, and regions PM in which the p-channel field-effect transistors are continuous.

Here, in the present embodiment, a stress control film 209 is a film of tensile stress and is formed as the plan pattern shown in FIG. 1 on each forming portion of the n-channel and p-channel field-effect transistors. That is, of the stress control film covering the entire surface of the circuit layout, the semiconductor device is characterized in that the film is not formed on field regions enclosing the active regions of the p-channel field-effect transistors. In the transistor circuit shown in FIG. 1, the stress control film 209 is formed on portions other than on fields between active regions of the p-channel field-effect transistors, i.e., the stress control film is continuously formed on other elements in the direction in which the n-channel field-effect transistors are continuous.

When seen macroscopically, as in FIG. 9, slits (portions at which the film is discontinuous) are formed in the stress control film 209 in the regions PM in which the p-channel field-effect transistors are plurally formed.

Pattern diagrams in regard to cross-sectional structures A to D in the plane layout diagram of FIG. 1 are shown in FIGS. 10(a), 10(b) and 10(c). The semiconductor device of the present embodiment is configured by an n-channel field-effect transistor 210 and a p-channel field-effect transistor 230, which are formed on a main surface of a silicon substrate 201, and the stress control film 209, which is formed on upper surfaces of these transistors.

The n-channel field-effect transistors are configured by n-source/drain (212, 213) formed on a p-well 211, a gate insulating film 214, and a gate electrode 215. Silicides 217 and 218 are formed on an upper surface of the gate electrode 215 and on upper surfaces of the source/drain (212, 213). The n-source/drain consist of source regions or drain regions represented by opposing regions 212 and 213 that sandwich the gate electrode 215. Because the difference between a source and a drain is based on from where to where the electrical current flows, and because there is no basic structural difference, they are notated in the present specification as source/drain (212, 213). The p-channel field-effect transistors to be described subsequently are similar.

Channel portions are regions in which a drain current flows, and pictorially they are regions in the vicinity of a surface of the semiconductor substrate positioned below the gate insulating film. For example, they correspond to regions that are shallower than 100 nm from the substrate surface.

The p-channel field-effect transistors are configured by p-source/drain (232, 233) formed at an n-well 231, a gate insulating film 234, and a gate electrode 235. Silicides 237 and 238 are formed on an upper surface of the gate electrode 235 and on upper surfaces of the source/drain (232, 233). Side walls 216 and 236, which comprise silicon nitride (SiN) and a silicon oxide film ($SiO_2$), are formed at side walls of the gate insulating films 214 and 234, the gate electrodes 215 and 235, and the silicides 217, 218, 237 and 238. These transistors are insulated from other transistors by shallow trench isolations 202 comprising a silicon oxide film ($SiO_2$) or silicon nitride (SiN).

The gate insulating films 214 and 234 comprise a dielectric film made of a material such as silicon oxide (SiO$_2$), silicon nitride (SiN), titanium oxide (TiO$_2$), zirconium oxide (ZrO$_2$), hafnium oxide (HfO$_2$), or tantalum pentoxide (Ta$_2$O$_5$), or a laminate structure of these materials.

In a case where a direction joining the source and drain of the channel portions is disposed in the <100> axis direction of the semiconductor substrate, a longitudinal direction of the gate electrodes between the source and drain can be formed along the <100> axis direction of the semiconductor substrate or an axis direction equivalent thereto.

The gate electrodes 215 and 235 comprise a polycrystalline silicon film, a metallic film, such as tungsten (W), platinum (Pt), or ruthenium (Ru), or a laminate structure of these.

The stress control film 209 is formed on the upper surfaces of the n-channel and p-channel field-effect transistors. Moreover, interlayer insulating films 203 and 200, which comprise a BPSG (boron-doped phospho silicate glass) film, an SOG (spin on glass) film, a TEOS (tetra-ethyl-oxide-silicate) film, or a silicon oxide film formed by chemical vapor deposition or sputtering, and wiring 223, in which electrical connection is effected by a contact plug 207, are formed on an upper surface of the stress control film 209.

Here, in the present embodiment, the film stress of the stress control film 209 is characterized in that it is a tensile stress, and the film comprises mainly silicon nitride (SiN) and is formed by chemical vapor phase growth or sputtering.

The stress control film 209 is formed discontinuously above the shallow trench isolations, as seen in cross section. (A–B cross section of FIG. 1, FIG. 10(a)), across the source/drain of the p-channel field-effect transistors. For example, the stress control film 209 formed on two adjacent transistors, which sandwich a shallow trench isolation 202a, is discontinuous above the shallow trench isolation 202a. The stress control film formed on adjacent transistors is continuous, as seen in cross section (C–D cross section of FIG. 1, FIG. 10(c), across the n-channel field-effect transistors. That is, the stress control film is continuous above the shallow trench isolations, e.g., above 202d and 202e.

As shown in the B–C cross section of FIG. 1, the stress control film 209 is discontinuous in cross section across the n-channel and the p-channel via the shallow trench isolations, but portions hanging on the field regions become larger at the n-channel side.

It is not unconditionally necessary for portions at which the stress control film is discontinuous to have absolutely no film. The film at these portions is made to be at least thinner than it is at portions other than those. It does not matter if a somewhat thin film is formed. More preferably, it is desirable for the film to be thinned by 20% or more with respect to the thickness of the film formed on the source/drain of the n-channel field-effect transistors. Specifically, it is preferable for the thickness of the film on the source/drain of the n-channel field-effect transistors to be greater than 50 nm, and more preferably to be 80 nm or more, and it is desirable for the thickness of the film on fields adjacent to the active regions of the p-channel field-effect transistors to be 50 nm or more.

The 2NAND circuit indicated in the present embodiment represents an example in which the invention is applied to an actual electrical circuit layout. The plane layout may be one other than that indicated in the present embodiment; for example, the applied electrical circuit may be, for example, an AND circuit, a NOR circuit, an OR circuit, or an input/output buffer circuit. Also, the structure, materials, and manufacturing method, other than those of the stress control film, may be ones other than those indicated in the present embodiment.

The action and effects of the present embodiment will be described below.

The improvement of the drain current (increasing drain current) of field-effect transistors has advanced over the years with respect to the development of semiconductor devices, such as LSI. The present inventors clearly established the influence that transistor structure factors exert on the stress of channel portions, and they have discovered a method of improving the drain current of transistors in which the channel direction becomes a <100> axis direction.

FIG. 2 is a graph showing the stress dependency of drain currents of field-effect transistors in which the channel direction is the <100> axis direction. From FIG. 2, it will be understood that, in n-channel field-effect transistors, the drain current is increased by a tensile stress in directions parallel and orthogonal to the channel; and, in the p-channel field-effect transistors, the drain current is increased by a compression stress in directions parallel and orthogonal to the channel.

FIG. 6 is a graph showing results in which, in a field-effect transistor structure having a gate length of 0.08 µm, the influence that the stress of an SiN film, which covers the upper surface of the gate electrode, exerts on the stress (stress within the channel surface in a direction parallel to the drain current) of a portion (channel) in which drain current flows is stress-analyzed by a finite element method. From these results, it is clear that, when the film stress of the film covering the gate electrode becomes stronger at the tensile side, the stress of the channel portion also becomes stronger at the tensile side.

This is because the film enclosing the gate electrode is formed to expand as far as the upper surface of the source drain region, and the tensile stress (compression of the film) of the film at this portion shifts the stress of the channel portion to the tensile side.

Because the film is planarly formed in an actual device, biaxial stress, i.e., stress in directions parallel and orthogonal to the channel, acts on the channel portion of the transistors. In a case where the film (stress control film), which covers the upper surface of the gate electrode in which film stress is a tensile stress, is formed evenly on the entire upper surfaces and peripheries of the transistors, the tensile stress acts in directions parallel and orthogonal to the channel portion of the transistors. Thus, because the source of the force becomes smaller by etching part of the stress control film and reducing the area covering the transistors, the tensile stress generated at the channel portion of the transistors is alleviated in directions parallel and orthogonal to the channel.

When the plane layout of the stress control film is made appropriate in consideration of the results of stress dependency of the drain currents, as shown in FIG. 2, it becomes as follows. That is, in a semiconductor device including n-channel field-effect transistors and p-channel field-effect transistors, when the film stress of the film enclosing the gate electrode is a tensile stress, the film widely covers the gate electrode as far as peripheral regions in regard to the n-channel field-effect transistors. Thus, because it is possible to exert a strong tensile stress in directions parallel and orthogonal to the channel at the channel portion of the n-channel field-effect transistors, it is possible to increase the drain current.

The stress control film covers regions smaller than those at the n-channel old-effect transistor relative to the p-channel field-effect transistors. Because it is possible to alleviate tensile stress by covering minimal regions with the film (because it is possible to shift the stress to the compression side), an increase in drain current car be expected also in regard to the p-channel.

Thus, by configuring the invention in this manner, an improvement of the drain currents of both the n-channel and the p-channel can be expected. For this reason, it is possible to improve the overall characteristics of the semiconductor device.

Figure 12:
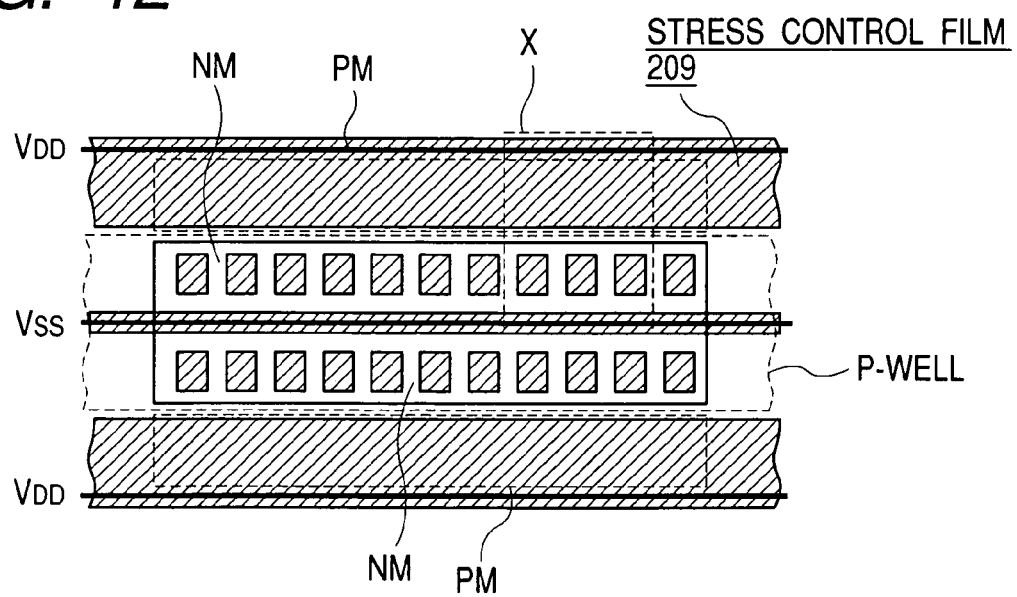
FIG. 12 is a diagrammatic plan view of the other semiconductor device pertaining to the first embodiment of the invention.

Conversely, in a case where the film stress of the film enclosing the gate electrode is a compression stress, the stress control film covers regions smaller than those at the p-channel field-effect transistors relative to the n-channel field-effect transistors, and the film preferably covers minimal regions, so that the film widely covers as far as peripheral regions in regard to the p-channel field-effect transistors. (FIGS. 11, 12)

As shown in FIG. 1, the semiconductor device of the first embodiment of the invention removes the stress control film on the fields corresponding to the active regions enclosed by the element isolating regions of the p-channel field-effect transistors from the stress control film of tensile film stress covering the entire surface of the circuit. Thus, it is possible to reduce the tensile stress in the direction parallel to the channel of the p-channel field-effect transistors. With respect to other directions, it is possible to cause the tensile stress to act in regard to directions parallel and orthogonal to the channel of the n-channel field-effect transistors.

Therefore, because the biaxis directional stress within the channel surfaces of both the n-channel and p-channel field-effect transistors is controlled, the drain currents can be increased in both the n-channel and the p-channel.

Also, according to the present embodiment, it is preferable for the stress control film to be left at the n-channel field-effect transistors and the p-channel field-effect transistors and as far as regions in which contact holes are formed. Thus, in a case where silicon nitride (SiN) is used for the stress control film 209, the stress control film can also be used, after formation of the interlayer insulating film, as an etching stopper when the contact holes are opened in the interlayer insulating film comprising a silicon oxide film for improving the electrical connection from upper layer wiring in the source and drain regions.

Also, because the manufacture of the stress control film described in the present embodiment can be conducted in a process that is the same as that for forming self-aligning contact holes, it is possible to share a mask with the self-aligning contact holes. That is, after the stress control film 209 has been evenly formed, the stress control film manufacturing process (removal of the stress control film above the shallow trench isolations 202c and 202b) can be conducted at the same time as the self-aligning contact hole manufacturing process. A conventional process for conducting self-aligning contact may be continued with respect to subsequent manufacturing. In this manner, according to the invention, because a conventional process can be used simply by changing the mask layout, a semiconductor device can be obtained at a low manufacturing cost.

The tensile stress exerted in the direction parallel to the channel of the p-channel field-effect transistors is preferably as small as possible. In other words, it is desirable for the stress control film on the p-channel field-effect transistors to be formed on contact hole forming regions, i.e., on portions used as self-aligning contact, and to not be formed on surrounding regions in which the element is not formed.

It is not unconditionally necessary for portions of the slits from which the stress control film has been removed to have absolutely no film. It does not matter if a somewhat thin film is formed. FIG. 24 is a graph showing results in which the sensitivity is analyzed in regard to the film thickness of the stress control film (assuming that the material is SiN in which the intrinsic stress is tensile stress) similar to the analysis shown in FIG. 6 in regard to the influence of structural factors on the stress of the channel portion in the transistors having a gate length of 0.08 µm. It is clear that, with respect to the stress of the channel portion that has been shifted to the tensile stress side by the stress control film of the tensile stress, the effects of the stress control film become drastically small when the film thickness of the stress control film becomes thinner than 50 nm. It is believed that the fact that the influence of the stress control film extending on the field regions from above the source/drain becomes small (the stress source becomes small) is one cause.

Therefore, it is desirable to reduce the thickness of the stress control film above the fields adjacent to the active regions of the p-channel field-effect transistors by 20% or more relative to the thickness of the film above the source/drain of the n-channel field-effect transistors. More preferably, the thickness of the film above the source/drain of the n-channel field-effect transistors is greater than 50 nm, and even more preferably 80 nm or more. It is also desirable for the thickness of the film above the fields adjacent to the active regions of the p-channel field-effect transistors to be 50 nm or less.

With respect to the above-described comparison of film thickness, it is preferable to compare it with the film formed on a NAND circuit that is used when, for example, the n-channel field-effect transistors and the p-channel field-effect transistors are opposed, as in the present embodiment.

The standard dimensions (thickness) used in the sensitivity analyses of FIGS. 6 and 24 for the present embodiment are indicated below. The gate length is 80 nm, the gate height is 150 nm, the side wall film thickness (portion contacting silicon substrate) is 50 nm, the silicide film thickness is 30 nm, the STI trench width is 5 µm, the STI trench depth is 350 nm, and the distance from the gate electrode to the STI is 0.62 µm. Because these dimensions are miniaturized in accompaniment with raising the performance of the semiconductor device, it is not intended that the application of the invention is limited to these dimensions.

In the semiconductor device including the n-channel field-effect transistors and the p-channel field-effect transistors formed on the silicon substrate, the direction in which the drain current of the transistors mainly flows is parallel to the <100> crystal axis, or parallel to an axis equivalent to the <100> crystal axis. The Raman shift of Raman spectrometry, when a laser is irradiated onto the channel portion of the n-channel field-effect transistors, is smaller than the Raman shift of Raman spectrometry when a laser is irradiated onto the channel portion of the p-channel field-effect transistors.

For example, the intervals in the crystal lattice, when the channel portion of the n-channel field-effect transistors is observed with a TEM, are wider than the intervals in the crystal lattice when the channel portion of the p-channel field-effect transistors is observed with a TEM. It is preferable to use, for each sample, samples formed along a direction that crosses the source/drain.

Next, a second embodiment of the invention will be described with reference to FIG. 10(a) and FIGS. 13 to 17. The present embodiment will be described using FIG. 10(a), which is a representative cross-sectional structure of the first embodiment.

The manufacturing method of the present embodiment is as follows.

Figure 13:
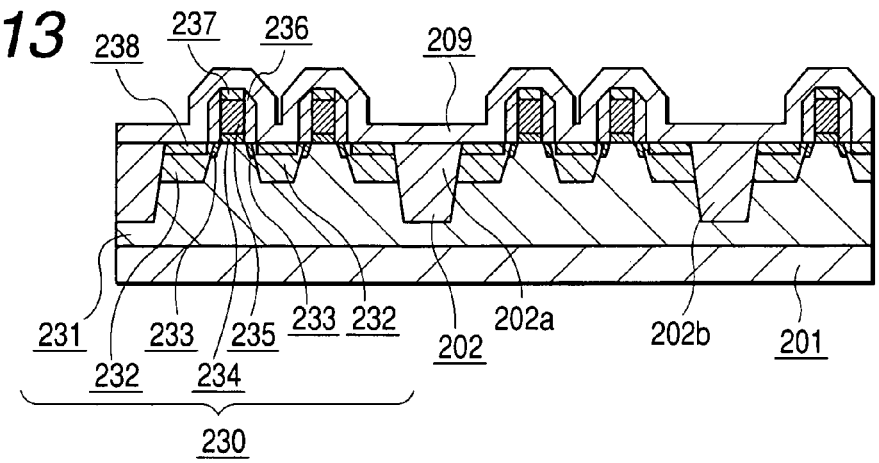
FIG. 13 is a cross-sectional view showing a step in the manufacturing process of the semiconductor device pertaining to the first embodiment of the invention.

(1) The field-effect transistor 230 and the suicides 218 and 217 are formed on the silicon substrate 201, and the stress control film 209 is formed on the entire upper surface thereof. (FIG. 13)

Figure 14:
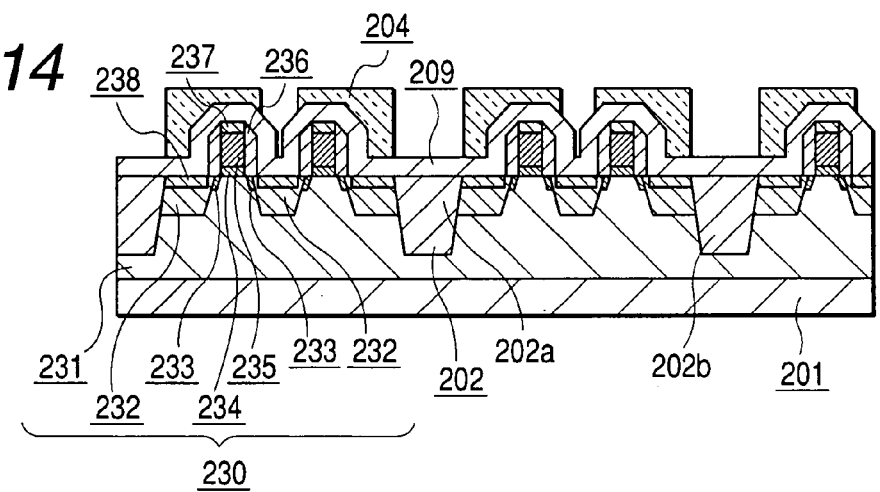
FIG. 14 is a cross-sectional view showing a step in the manufacturing process of the semiconductor device pertaining to the first embodiment of the invention.

(2) A mask 204 that processes the stress control film 209 is formed on the upper surface of the stress control film 209. The mask pattern serves in processing for stress control and processing for the formation of the contact plugs 207. (FIG. 14)

Figure 15:
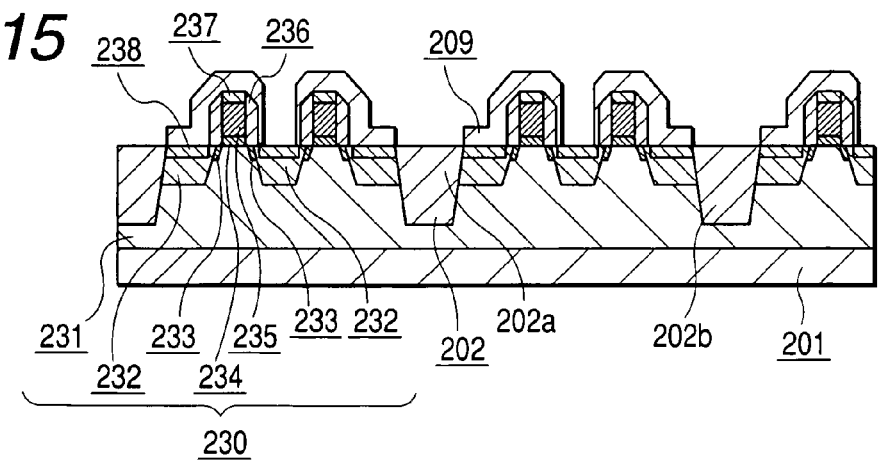
FIG. 15 is a cross-sectional view showing a step in the manufacturing process of the semiconductor device pertaining to the first embodiment of the invention.

(3) The stress control film 209 is processed by etching. (FIG. 15)

Figure 16:
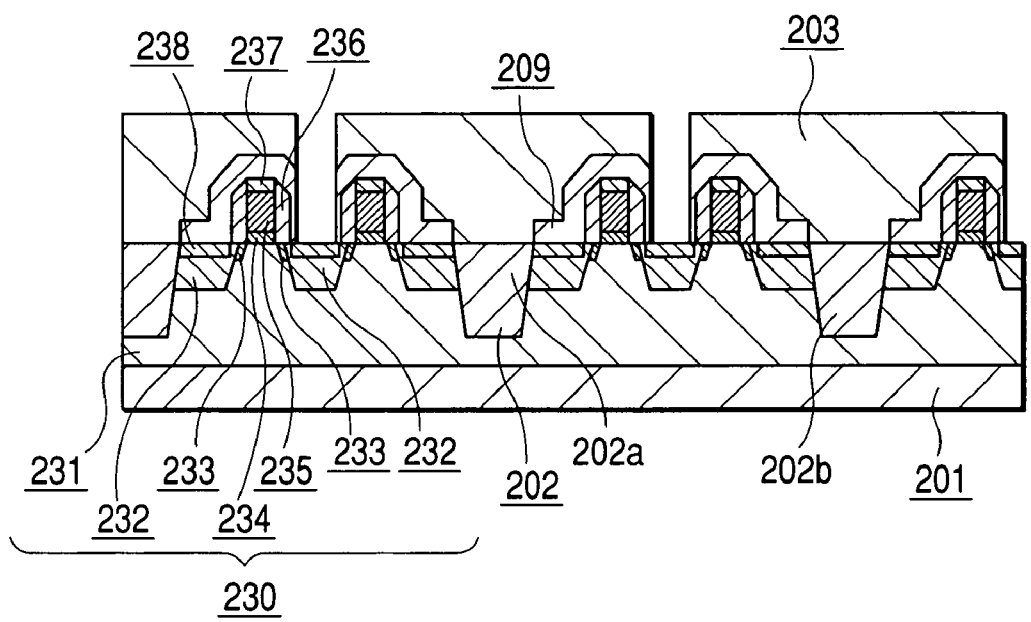
FIG. 16 is a cross-sectional view showing a step in the manufacturing process of the semiconductor device pertaining to the first embodiment of the invention.

(4) The interlayer insulating film 302 is formed, and holes are opened only at portions where the contact plugs 207 are formed. (FIG. 16)

Figure 17:
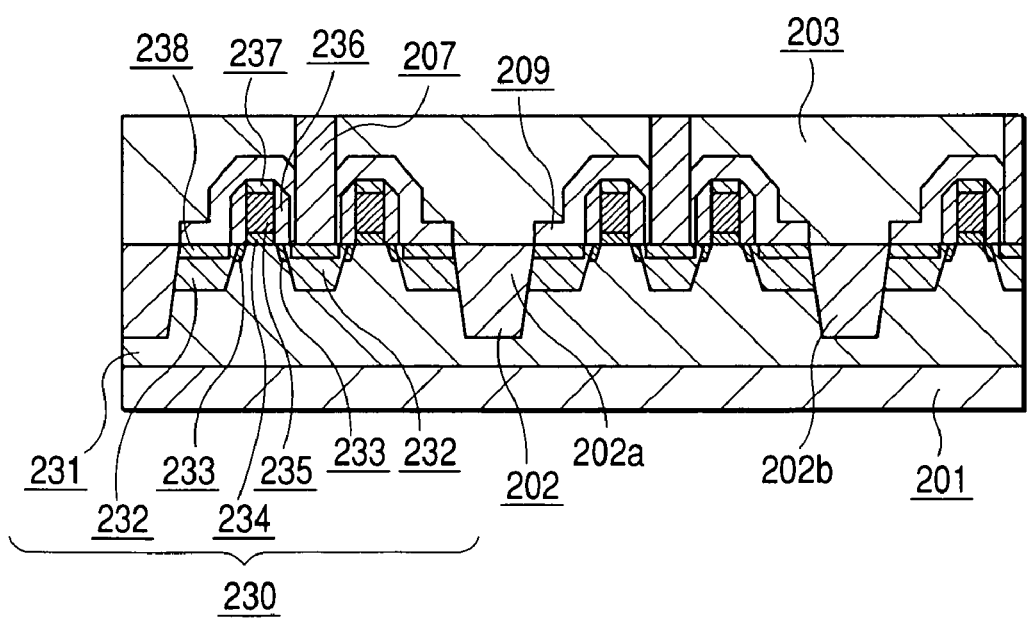
FIG. 17 is a cross-sectional view showing a step in the manufacturing process of the semiconductor device pertaining to the first embodiment of the invention.

(5) The contact plugs 207 are formed. (FIG. 17)

(6) The upper surface wiring 223 and an interlayer insulating film 220 are formed. (FIG. 10(a))

According to the present embodiment, the process of stress control of the stress control film 209 and the process of self-aligning contact for forming the contact plugs can be conducted at the same time using the same mask. Therefore, a highly reliable semiconductor device is obtained at a low manufacturing cost.

The manufacturing method indicated in the present embodiment is nothing more than an example of a method for manufacturing the first embodiment. The manufacturing method of the first embodiment may be one other than that of the present embodiment.

Figure 4:
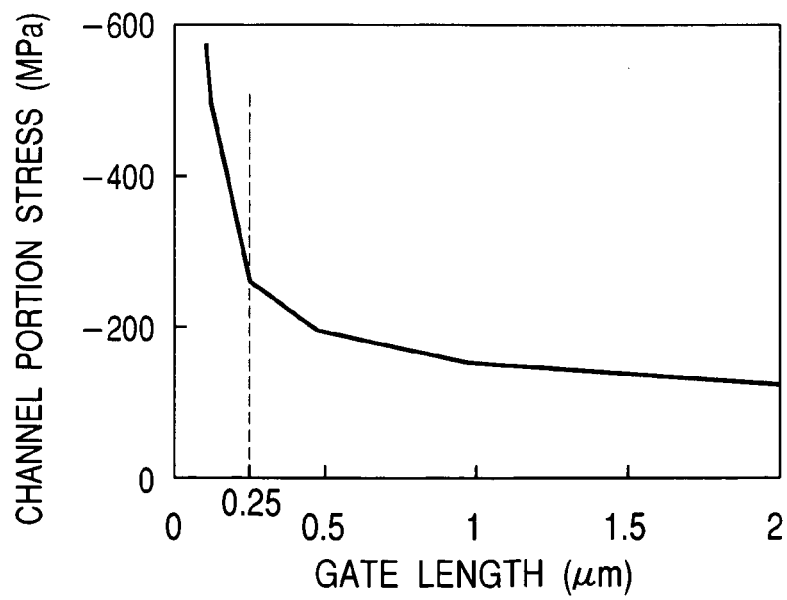
FIG. 4 is a graph showing results in which the stress of channel portions of each generation of gate lengths is analyzed.
Figure 5:
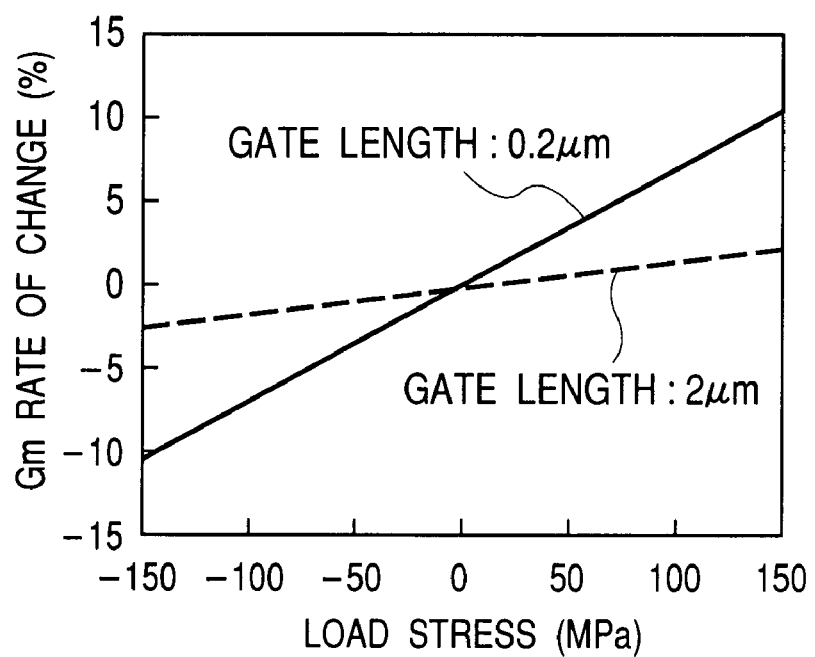
FIG. 5 is a graph showing experimental results representing differences in dependency with respect to stress of the mutual conductance (Gm) resulting from generations of field-effect transistors.
Figure 18:
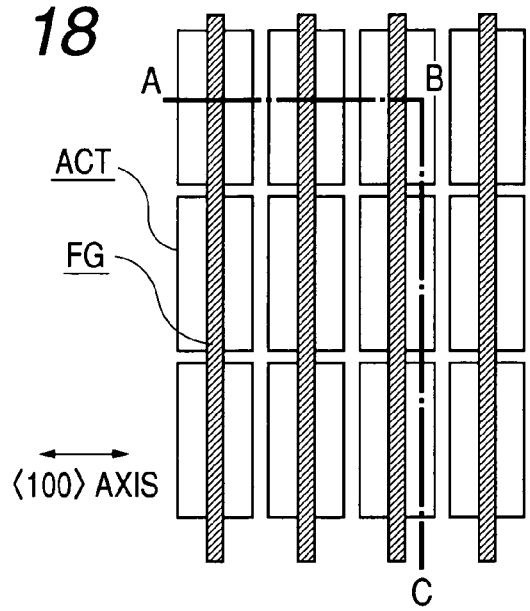
FIG. 18 is a diagrammatic plan view of a semiconductor device pertaining to a third embodiment of the invention.
Figure 19A:
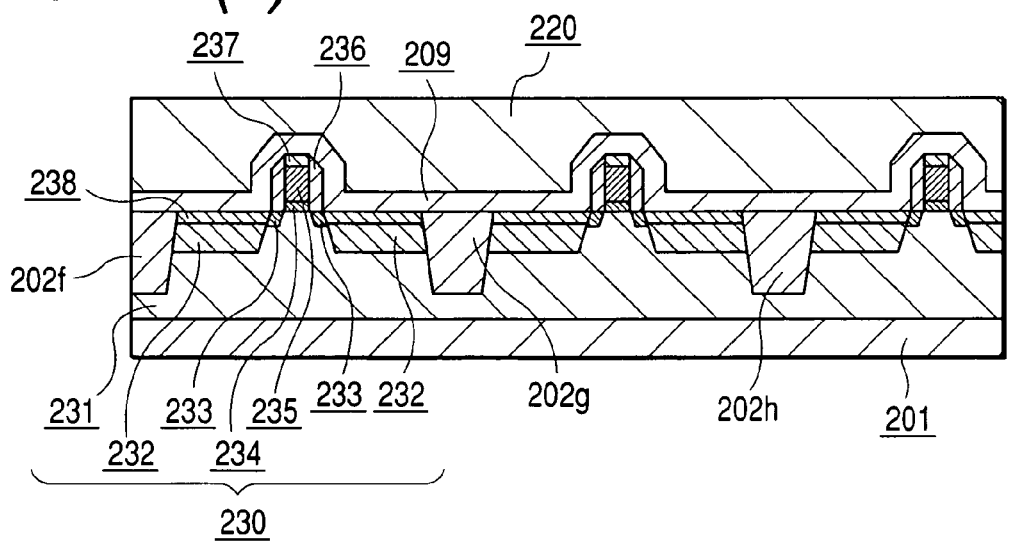
FIGS. 19(a) and 19(b) are cross-sectional views of the semiconductor device pertaining to the third embodiment of the invention, taken along lines A–B and B–C, respectively, in FIG. 18.
Figure 19B:
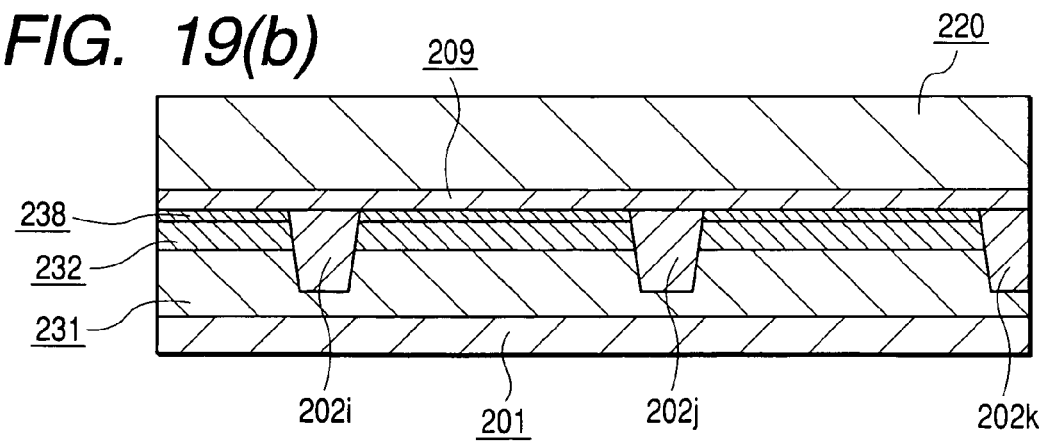
Figure 20:
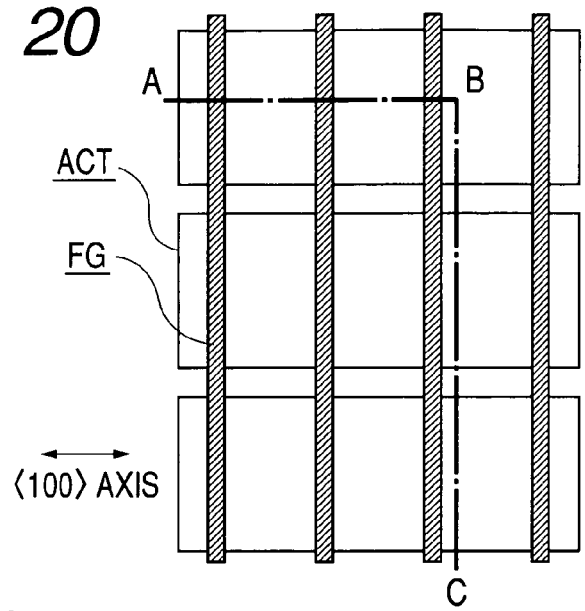
FIG. 20 is a diagrammatic plan view of a comparative example of the semiconductor device pertaining to the third embodiment of the invention.
Figure 21A:
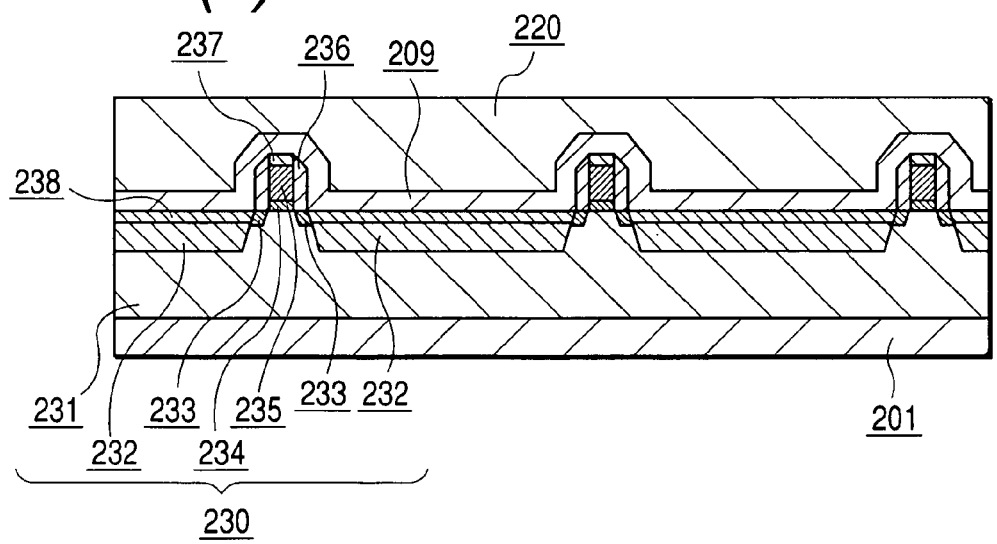
FIGS. 21(a) and 21(b) are cross-sectional views of the comparative example of the semiconductor device pertaining to the third embodiment of the invention, taken along lines A–B and B–C, respectively, in FIG. 20.
Figure 21B:
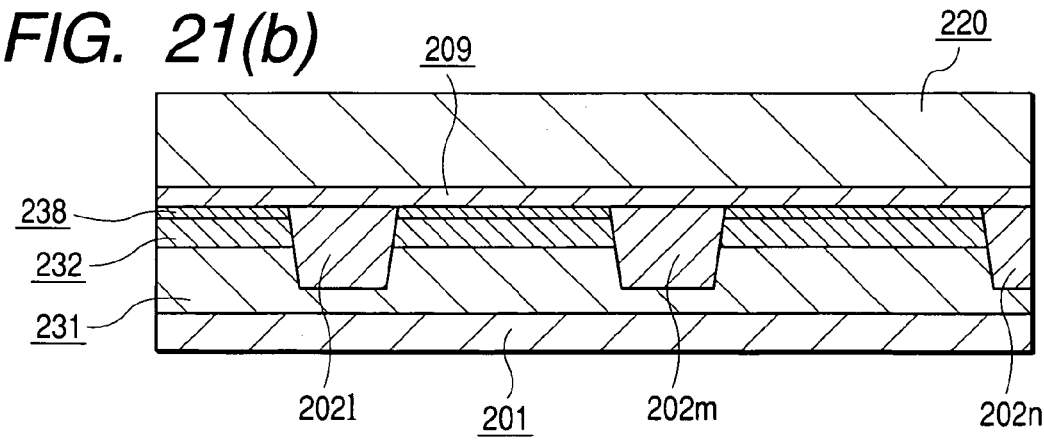

Next, a third embodiment of the invention will be described with reference to FIGS. 4 and 18 to 21(b). FIG. 4 is a graph showing results in which stress of channel portions of field-effect transistors of each generation of gate lengths is analyzed; FIG. 18 is a pattern diagram showing a plane layout of a semiconductor device pertaining to the third embodiment of the invention; FIG. 19(a) is a pattern diagram (cross section along the A–B line of FIG. 18) of a cross section of the semiconductor device of the invention; FIG. 19(b) is a pattern diagram (cross section along the B–C line of FIG. 18) of the cross section of the semiconductor device of the invention; FIG. 20 is a pattern diagram showing a plane layout of a conventional semiconductor device; FIG. 21(a) is a pattern diagram (cross section along the A–B line of FIG. 20) of a cross section of the conventional semiconductor device; and FIG. 21(b) is a pattern diagram (cross section along the B–C line of FIG. 20) of a cross section of the semiconductor device of the invention.

The difference between the present embodiment and the first embodiment is that, whereas the stress control of the channel portion was based on the form of the stress control film in the first embodiment, the stress control is based on the trench width of STIs in the present embodiment.

As shown in FIG. 18, the semiconductor device of the present embodiment is a circuit in which plural p-channel field-effect transistors, in which the channel direction is parallel to the <100> axis, are disposed so as to be mutually adjacent via STIs on active ACT regions.

FIGS. 19(a) and 19(c) shows a pattern diagrams of the cross-sectional structures A to B and B to C in the plane layout of FIG. 18. The semiconductor device of the present embodiment is configured by plural p-channel field-effect transistors 230 and shallow trench isolations (STI) that isolate the transistors, which transistors and shallow trench isolations are formed on a main surface of the silicon substrate 201.

The p-channel field-effect transistors are configured by p-source/drain (232, 233) formed on the n-well 231, the gate insulating film 234, and the gate electrode 235. The silicides 237 and 238 are formed on the upper surface of the gate electrode 235 and on the upper surfaces of the source/drain (232, 233). The side wall 236 is formed on the gate insulating film 234 and the gate electrode 235 and on the side wall of the silicides 237 and 238. These transistors are insulated from other transistors by the shallow trench isolations 202. The same materials, method of film formation, and structural dimensions as those described in connected with the first embodiment may be used.

Here, the trench width of the element isolating regions adjacent to the p-channel field-effect transistors is formed to be narrower than the trench width of the element isolating regions adjacent to the n-channel field-effect transistors.

As one example, it is preferable for the trench width of the STIs adjacent to the active regions of the p-channel field-effect transistors to be as narrow as possible. Specifically, it is preferable for the trench width to be 0.25 μm or less, and more preferably to be a minimum manufacturing dimension in the semiconductor device.

The action and effects of the semiconductor device of the present embodiment will be described below.

First, an example of a plane layout of a comparative example will be described using FIGS. 20, 21(a) and 21(b). The plane layout shows a circuit layout that is used in a portion of a semiconductor device constituted by complementary field-effect transistors and is constituted by plural p-channel field-effect transistors. The channel direction is the <100> axis direction. The plural p-channel field-effect transistors are formed on plurally disposed active ACT regions via STIs (202l, 202m, 202n) so as to share source drain (232, 233) regions. The plane layout of the p-channel field-effect transistors is heavily used in semiconductor devices using complementary field-effect transistors, such as PLL oscillators.

As described above, the improvement of drain currents of field-effect transistors has become an issue in the development of semiconductor devices, such as LSI. Thus, the present inventors conceived, on the basis of this knowledge, a plane layout that improves drain currents using stress (strain).

The Shallow Trench Isolation (STI) used for forming the complementary field-effect transistors is essential for isolating an element, such as transistors, electrically, but since the inside of the trenches in the STI is easily oxidized to produce volume expansion, the STI is preferably made of a material in generating the compression stress which is strong against the adjacent active.

In the plane layout of the comparative example shown in FIG. 20, the trench width of the STIs (202l, 202m, 202n) in a direction orthogonal to the channel is not sufficiently controlled from the standpoint of stress. Moreover, in regard to the direction parallel to the channel, because a tensile stress accompanying crystallization of the silicide 238 is generated, this is a factor that lowers the drain currents of the p-channel field-effect transistors.

Thus, the present inventors have considered using the stress of the STIs to load stress on the channel portion and improve the drain currents. As described above, the stress of the STIs stems from cubical expansion resulting from oxidation of the insides of the shallow, narrow trenches formed in the silicon substrate. Because restraint with respect to cubical expansion becomes large when the trench width becomes narrow, the compression stress generated at adjacent active regions becomes large. In the graph showing changes in stress of channel portions in each generation of the gate length shown in FIG. 4, the reason stress increases when the miniaturization of design rules advances is because a contribution resulting from an increase in stress stemming from oxidation due to the trenches of the STIs becoming smaller is large. Particularly, when the trench width is 0.25 μm or less, the increase in stress becomes large.

In the semiconductor device of the present embodiment, it is preferable to narrow, as much as possible, the trench width of the STIs (202*l*, 202*m*, 202*n*) adjacent to the p-channel field-effect transistors (a distance to the next active region adjacent via STI) in a direction parallel and orthogonal to the channel. Specifically, it is preferable for the trench width to be 0.25 μm or less, and more preferably for the trench width to be a minimum structural dimension in the semiconductor device.

As a result, because compression stress can be exerted to the channel portions in directions orthogonal and parallel to the channel, the effect that the drain currents can be increased is obtained. Also, according to the third embodiment, a conventional manufacturing process can be used as it is simply by altering the layout.

The present embodiment has been described as one mode of the invention. The invention is characterized in that the trench width of the STIs adjacent to the p-channel field-effect transistors is as narrow as possible, preferably 0.25 μm or less, and more preferably a minimum structural dimension in the semiconductor device. The invention is not limited to the PLL described in the conventional example.

Also, the present embodiment is one in which the trench width of the STIs is made appropriate. The gate electrode and other structures may be different from those in the present embodiment.

Figure 22:
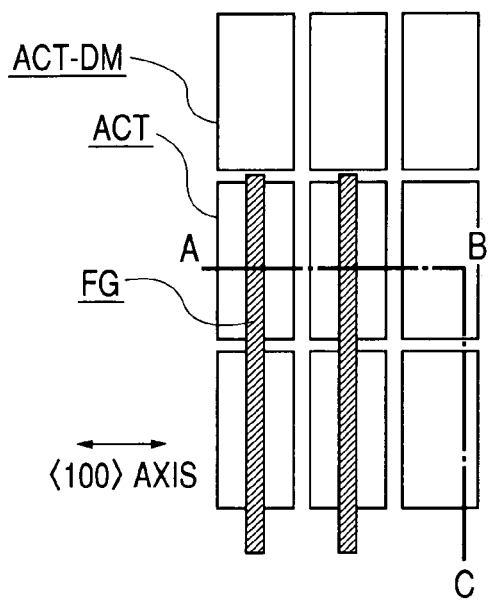
FIG. 22 is a diagrammatic plan view of a semiconductor device pertaining to a fourth embodiment of the invention.
Figure 23A:
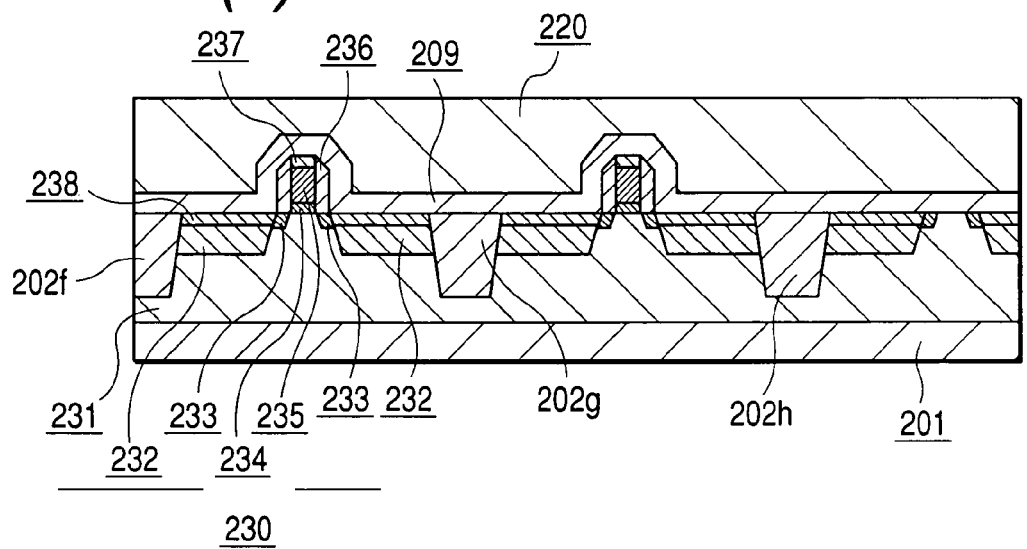
FIGS. 23(a) and 23(b) are cross-sectional views of the semiconductor device pertaining to the fourth embodiment of the invention, taken along lines A–B and B–C, respectively, in FIG. 22.
Figure 23B:
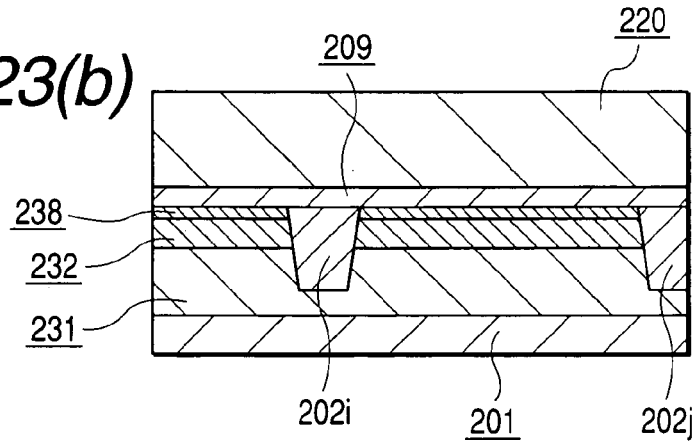

Next, a fourth embodiment of the invention will be described with reference to FIGS. 22, 23(*a*) and 23(*b*). FIG. 22 is a pattern diagram showing a plane layout of a semiconductor device pertaining to the fourth embodiment of the invention; FIG. 23(*a*) is a pattern diagram (cross section along the A–B line of FIG. 22) of a cross section of the semiconductor device of the invention; and FIG. 23(*b*) is a pattern diagram (cross section along the B–C line of FIG. 22) of the cross section of the semiconductor device of the invention.

The difference between the present embodiment and the first embodiment is that, whereas the stress control of the channel portion was based on the form of the stress control film in the first embodiment, the stress control is based the trench width of STIs in the present embodiment. The difference between the present embodiment and the third embodiment is that the control of the trench width of the adjacent STI is carried out with the active forming no transistor (hereafter referred to as a dummy-active).

As shown in FIG. 22, the semiconductor device of the present embodiment is a circuit configured by p-channel field-effect transistors in which the channel direction is the <100> axis direction. The trench width of the element isolating regions adjacent to the p-channel field-effect transistors is narrower than the trench width of the element isolating regions adjacent to the n-channel field-effect transistors. For example, other transistors or dummy-active regions ACT-DM are formed so that the trench width of the STIs adjacent to the active ACT regions formed by the transistors is preferably as narrow as possible, specifically 0.25 μm or less, and more preferably a minimum structural dimension in the semiconductor device.

It is not necessary for the form of the dummy-active regions ACT-DM to be the same as that of the active ACT regions formed by the transistors. For example, the STI (202*i*) between the dummy-active regions does not have to be formed.

The action and effects of the semiconductor device of the present embodiment will be described below.

As in the third embodiment, when the p-channel field-effect transistors are formed in directions parallel and orthogonal to the channel, the drain currents can be increased by changing the mutual disposition in order to narrow the trench width of the adjacent STIs. However, when the p-channel field-effect transistors are not formed at adjacent positions due to the positional relationship with other electrical circuits and the end portion of the circuit, application of the third embodiment is difficult.

Thus, as in the present embodiment, the trench width of the STIs adjacent to the p-channel field-effect transistors can be narrowed by forming the dummy-active regions ACT-DM not formed by the transistors.

Thus, because compression stress can be loaded at the p-channel field-effect transistors of the end portion of the circuit in both directions parallel and orthogonal to the channel, the effect that the drain currents can be increased, similar to the third embodiment, is obtained. Also, according to the present embodiment, a conventional manufacturing process can be used as it is simply by changing the layout, similar to the third embodiment.

According to the invention, it is possible to effectively realize, in a semiconductor device including n-channel field-effect transistors and p-channel field-effect transistors, a semiconductor device having excellent drain current characteristics of both the n-channel field-effect transistors and the p-channel field-effect transistors.

What is claimed is:

1. A semiconductor device including a semiconductor substrate, a gate electrode and a plurality of transistors formed on the semiconductor substrate, the plurality of transistors being disposed with a drain and a source corresponding to the gate electrode, an insulating film formed above the transistors, with a direction joining the source and the corresponding drain of the transistors being formed in a direction along a <100> crystal axis or an axis equivalent to the <100> crystal axis, the transistors including a plurality of n-channel field-effect transistors and plurality of p-channel field-effect transistors, the insulating film including tensile stress, the insulating film that is formed in regions at the peripheries of the p-channel field-effect transistors and positioned in directions parallel and orthogonal to the direction joining the source and the drain including an insulating film that is thinner than the insulating film that is formed in regions at the peripheries of the n-channel field-effect transistors and positioned in directions parallel and orthogonal to the direction joining the source and the drain.

2. The semiconductor device of claim 1, further including an interlayer insulating film including an upper end above the insulating film and a wiring layer above the interlayer insulating film.

3. A semiconductor device including a semiconductor substrate, a plurality of active regions enclosed by field regions formed on the semiconductor substrate, a gate electrode and a plurality of transistors formed on the active regions, the plurality of transistors being disposed with a drain and a source corresponding to the gate electrode, an insulating film formed above the transistors, with a direction joining the source and the corresponding drain of the transistors being formed in a direction along a <100> crystal axis or an axis equivalent to the <100> crystal axis, the transistors including a plurality of n-channel field-effect transistors and a plurality of p-channel field-effect transistors corresponding to the n-channel field-effect transistors, the insulating film including tensile stress, wherein the insulating film that is thinner than the insulating film formed at regions positioned between the first n-channel field-effect transistors and the second n-channel field-effect transistors is formed on, or not disposed on, field regions adjacent to the active regions formed by the p-channel field-effect transistors.

4. A semiconductor device including n-channel field-effect transistors and p-channel field-effect transistors formed on a silicon substrate, wherein the n-channel field-effect transistors and the p-channel field-effect transistors are plurally included, a direction in which drain currents of the transistors mainly flow is a direction along a <100> crystal axis or an axis equivalent to the <100> crystal axis, an insulating film including tensile stress is formed at upper portions of the n-channel field-effect transistors and the p-channel field-effect transistors, and the insulating film that is thinner than the insulating film formed at regions positioned between first n-channel field-effect transistors and second n-channel field-effect transistors is formed on or not disposed on field regions adjacent the active regions of the p-channel field-effect transistors.

5. A semiconductor device including a semiconductor substrate, a gate electrode and a plurality of transistors formed on the semiconductor substrate, the plurality of transistors being disposed with a drain and a source corresponding to the gate electrode, an insulating film formed above the transistors, with a direction joining the source and the corresponding drain of the transistors being formed in a direction along a <100> crystal axis or an axis equivalent to the <100> crystal axis, the transistors including a plurality of n-channel field-effect transistors and a plurality of p-channel field-effect transistors, the insulating film including compression stress, the insulating film that is formed in regions at the peripheries of the n-channel field-effect transistors and positioned in directions parallel and orthogonal to the direction joining the source and the drain including an insulating film that is thinner than the insulating film that is formed in regions at the peripheries of the p-channel field-effect transistors and positioned in directions parallel and orthogonal to the direction joining the source and the drain.

6. A semiconductor device including a semiconductor substrate, a plurality of active regions enclosed by field regions formed on the semiconductor substrate, a gate electrode and a plurality of transistors formed on the active regions, the plurality of transistors being disposed with a drain and a source corresponding to the gate electrode, an insulating film formed above the transistors, with a direction joining the source and the corresponding drain of the transistors being formed in a direction along a <100> crystal axis or an axis equivalent to the <100> crystal axis, the transistors including a plurality of n-channel field-effect transistors and a plurality of p-channel field-effect transistors, the insulating film including compression stress, wherein the insulating film that is thinner than the insulating film formed at regions positioned between first p-channel field-effect transistors and second p-channel field-effect transistors is formed on, or not disposed on, field regions adjacent to the active regions of the n-channel field-effect transistors.

7. A semiconductor device including a plurality of active regions enclosed by field regions formed on a silicon substrate and n-channel field-effect transistors and p-channel field-effect transistors formed in the active regions, wherein the n-channel field-effect transistors and the p-channel field-effect transistors are plurally included, a direction in which drain currents of the transistors mainly flow is a direction along a <100> crystal axis, or an axis equivalent to the <100> crystal axis, an insulating film including compression stress is formed at upper portions of the n-channel field-effect transistors and the p-channel field-effect transistors, and the insulating film that is thinner than the insulating film formed at regions positioned between first p-channel field-effect transistors and second p-channel field-effect transistors is formed on, or not disposed on, field regions adjacent to active regions of the n-channel field-effect transistors.

* * * * *